United States Patent
Gobbi et al.

(10) Patent No.: US 10,345,348 B2
(45) Date of Patent: Jul. 9, 2019

(54) DETECTION CIRCUIT FOR AN ACTIVE DISCHARGE CIRCUIT OF AN X-CAPACITOR, RELATED ACTIVE DISCHARGE CIRCUIT, INTEGRATED CIRCUIT AND METHOD

(71) Applicant: STMICROELECTRONICS S.R.L., Agrate Brianza (IT)

(72) Inventors: Massimiliano Gobbi, Castel San Giovanni (IT); Ignazio Salvatore Bellomo, Rozzano (IT); Domenico Tripodi, Milan (IT); Antonio Borrello, Trezzano Sul Naviglio (IT); Alberto Bianco, Gressan (IT)

(73) Assignee: STMicroelectronics S.r.l., Agrate, Brianza (IT)

( * ) Notice: Subject to any disclaimer, the term of this patent is extended or adjusted under 35 U.S.C. 154(b) by 365 days.

(21) Appl. No.: 14/838,125

(22) Filed: Aug. 27, 2015

(65) Prior Publication Data

US 2016/0124029 A1 May 5, 2016

(30) Foreign Application Priority Data

Nov. 4, 2014 (IT) .............................. TO2014A0906

(51) Int. Cl.
*H02J 7/00* (2006.01)
*G01R 19/165* (2006.01)
(Continued)

(52) U.S. Cl.
CPC ....... *G01R 19/16557* (2013.01); *G01R 19/04* (2013.01); *H02J 7/0072* (2013.01); *H02J 7/345* (2013.01); *H02M 2001/322* (2013.01)

(58) Field of Classification Search
CPC . G01R 19/16557; G01R 19/04; H02J 7/0072; H02J 7/345
(Continued)

(56) References Cited

U.S. PATENT DOCUMENTS 3,584,295 A * 6/1971 Bayer .................... G01R 27/28
324/601
4,342,013 A * 7/1982 Kallman ................ H02H 9/005
177/185
(Continued)

FOREIGN PATENT DOCUMENTS

| CN | 202661533 U | 1/2013 |
| CN | 202840923 U | 3/2013 |

(Continued)

OTHER PUBLICATIONS

Gravati et al., "Peak Voltage Detector and Related Method of Generating an Envelope Voltage," U.S. Appl. No. 14/510,925, filed Oct. 9, 2014, 35 pages.

*Primary Examiner* — Robert J Grant
*Assistant Examiner* — John T Trischler
(74) *Attorney, Agent, or Firm* — Seed IP Law Group LLP

(57) ABSTRACT

An active discharge circuit discharges an X capacitor and includes a sensor circuit that generates a sensor signal indicative of an AC voltage at the X capacitor. A processing unit generates a reset signal as a function of a comparison signal. A comparator circuit generates the comparison signal by comparing the sensor signal with a threshold. A timer circuit sets a discharge enable signal to a first logic level when the timer circuit is reset via a reset signal. The timer circuit determines the time elapsed since the last reset and tests whether the time elapsed exceeds a given timeout value. If the time elapsed exceeds the given timeout value, the timer circuit sets the discharge enable signal to a second
(Continued)

logic level. A dynamic threshold generator circuit varies the threshold of the comparator circuit as a function of the sensor signal.

14 Claims, 10 Drawing Sheets

(51) Int. Cl.
*G01R 19/04* (2006.01)
*H02M 1/32* (2007.01)
*H02J 7/34* (2006.01)

(58) Field of Classification Search
USPC .................................. 320/166; 324/76.11
See application file for complete search history.

(56) References Cited

U.S. PATENT DOCUMENTS

| | | | | |
|---|---|---|---|---|
| 4,658,198 A * | 4/1987 | Thurber, Jr. | ...... | G01R 19/16576 307/109 |
| 4,667,173 A * | 5/1987 | Okochi | ............... | H03H 1/0007 333/168 |
| 4,716,759 A * | 1/1988 | Tanaka | ................ | G01L 23/08 73/114.16 |
| 4,835,453 A * | 5/1989 | Munning Schmidt | ...... | G01R 31/36 320/128 |
| 4,910,654 A * | 3/1990 | Forge | ................ | H02H 9/001 323/908 |
| 5,061,913 A * | 10/1991 | Okochi | ............... | H03H 7/0115 333/12 |
| 5,083,101 A * | 1/1992 | Frederick | ............ | H03H 1/0007 333/12 |
| 5,179,362 A * | 1/1993 | Okochi | ................ | H04B 15/02 333/12 |
| 5,281,955 A * | 1/1994 | Reich | ............... | G01R 31/3624 320/136 |
| 5,287,008 A * | 2/1994 | Pahr | ................ | H02H 9/005 307/89 |
| 5,381,074 A * | 1/1995 | Rudzewicz | ............ | B60Q 3/85 307/10.8 |
| 5,446,404 A * | 8/1995 | Badyal | ............... | H03K 17/223 327/143 |
| 5,483,142 A * | 1/1996 | Skibinski | ............... | H02H 9/001 320/166 |
| 5,513,088 A * | 4/1996 | Williamson | ............ | H02J 9/062 363/21.15 |
| 5,568,041 A * | 10/1996 | Hesterman | ......... | H02M 1/4225 323/207 |
| 5,615,097 A * | 3/1997 | Cross | ................ | H02H 7/1252 361/111 |
| 5,638,262 A * | 6/1997 | Brown | ............. | H02M 3/33523 363/19 |
| 5,644,468 A * | 7/1997 | Wink | ................ | H01G 4/385 361/301.5 |
| 5,757,627 A * | 5/1998 | Faulk | ................ | H02M 1/36 363/21.14 |
| 5,796,182 A * | 8/1998 | Martin | ............... | H02J 9/062 307/46 |
| 5,841,641 A * | 11/1998 | Faulk | ................ | H02M 3/335 363/21.14 |
| 5,969,583 A * | 10/1999 | Hutchison | ............ | H03H 7/427 333/12 |
| 6,018,229 A * | 1/2000 | Mitchell | .............. | G06F 1/26 320/112 |
| 6,088,243 A * | 7/2000 | Shin | ................ | H02J 9/005 363/21.05 |
| 6,157,528 A * | 12/2000 | Anthony | ............... | H01C 7/021 333/12 |
| 6,163,470 A * | 12/2000 | Chavez | ............... | H02H 9/001 323/908 |
| 6,166,930 A * | 12/2000 | Czerwinski | ........... | H02M 5/271 318/811 |
| 6,218,913 B1 * | 4/2001 | Pagenkopf | .......... | H03H 1/0007 307/105 |
| 6,243,276 B1 * | 6/2001 | Neumann | .............. | H02H 5/047 323/901 |
| 6,275,044 B1 * | 8/2001 | Scott | ........................ | H02H 7/26 324/520 |
| 6,343,021 B1 * | 1/2002 | Williamson | ............ | H02M 1/10 363/163 |
| 6,385,058 B1 * | 5/2002 | O'Meara | ........... | H02M 3/33561 363/21.01 |
| 6,388,856 B1 * | 5/2002 | Anthony | ................ | H01C 7/021 333/12 |
| 6,404,170 B2 * | 6/2002 | Okamura | .............. | H02J 7/0016 320/122 |
| 6,448,845 B2 * | 9/2002 | Davies | ................... | G11C 16/12 327/538 |
| 6,522,516 B2 * | 2/2003 | Anthony | ................ | H01C 7/021 307/105 |
| 6,549,014 B1 * | 4/2003 | Kutkut | .................. | G01R 1/203 320/132 |
| 6,630,751 B2 * | 10/2003 | Curtis | .................... | H02J 9/062 307/64 |
| 6,737,845 B2 * | 5/2004 | Hwang | ............ | H02M 1/0845 323/222 |
| 6,798,175 B2 * | 9/2004 | Hanada | ................. | H02H 9/001 320/164 |
| 6,806,806 B2 * | 10/2004 | Anthony | ................ | H01C 7/021 333/12 |
| 6,873,513 B2 * | 3/2005 | Anthony | ................ | H01G 4/012 257/E23.079 |
| 6,894,884 B2 * | 5/2005 | Anthony, Jr. | ........ | H05K 1/0231 361/111 |
| 7,042,303 B2 * | 5/2006 | Anthony | ................ | H01G 2/065 257/E23.079 |
| 7,046,529 B2 * | 5/2006 | Chang | ................ | H02M 1/4225 363/44 |
| 7,050,284 B2 * | 5/2006 | Anthony | ................ | H01G 4/012 361/118 |
| 7,113,383 B2 * | 9/2006 | Anthony | ................... | H01C 1/14 257/E23.067 |
| 7,141,899 B2 * | 11/2006 | Anthony | ............... | H01R 13/719 310/68 R |
| 7,274,112 B2 * | 9/2007 | Hjort | ..................... | H02J 9/062 307/64 |
| 7,355,831 B2 * | 4/2008 | Raiser | ................... | H02H 9/041 361/93.1 |
| 7,423,860 B2 * | 9/2008 | Anthony | ................ | H01G 4/012 257/E23.079 |
| 7,427,816 B2 * | 9/2008 | Anthony | ............. | H02K 11/024 310/68 R |
| 7,443,647 B2 * | 10/2008 | Anthony | ................ | H01C 7/123 361/118 |
| 7,528,502 B2 * | 5/2009 | Maeda | ..................... | H02J 7/34 307/46 |
| 7,593,208 B2 * | 9/2009 | Anthony | ................ | H01G 4/012 361/118 |
| 7,599,196 B2 * | 10/2009 | Alexander | .......... | H02M 3/1582 363/124 |
| 7,675,729 B2 * | 3/2010 | Anthony | .................. | H01G 4/35 361/118 |
| 7,737,580 B2 * | 6/2010 | Hjort | .................... | H02J 7/0047 307/46 |
| 7,778,045 B2 * | 8/2010 | Alexander | .......... | H02M 3/1582 363/124 |
| 7,782,036 B1 * | 8/2010 | Wong | ................... | H02M 3/156 323/282 |
| 7,855,472 B2 * | 12/2010 | Hjort | .................... | H02J 7/0047 307/64 |
| 7,949,885 B2 * | 5/2011 | Kikuchi | .................... | G06F 1/30 399/37 |
| 7,982,438 B2 * | 7/2011 | Gerber | ..................... | G05F 3/30 320/166 |
| 8,000,676 B2 * | 8/2011 | Kim | ........................ | H04B 1/30 455/298 |

(56) References Cited

U.S. PATENT DOCUMENTS

| | | | | |
|---|---|---|---|---|
| 8,053,927 | B2* | 11/2011 | Hjort | H02J 7/0047 307/64 |
| 8,115,457 | B2* | 2/2012 | Balakrishnan | H02M 1/32 320/166 |
| 8,159,092 | B2* | 4/2012 | Luthi | H02J 9/005 307/130 |
| 8,259,475 | B2* | 9/2012 | Shin | H02M 7/46 363/126 |
| 8,295,069 | B2* | 10/2012 | Alexander | H02M 5/225 363/132 |
| 8,300,426 | B2* | 10/2012 | Alexander | H02M 3/1582 363/124 |
| 8,330,381 | B2* | 12/2012 | Langovsky | H05B 33/0809 315/200 R |
| 8,339,192 | B2* | 12/2012 | Busch | H02M 1/12 307/130 |
| 8,345,452 | B2* | 1/2013 | Alexander | H02M 3/1582 363/124 |
| 8,369,051 | B2* | 2/2013 | Skatulla | H02M 1/36 361/18 |
| 8,391,033 | B2* | 3/2013 | Alexander | H02M 5/275 361/54 |
| 8,395,910 | B2* | 3/2013 | Alexander | H02M 3/1582 363/142 |
| 8,400,800 | B2* | 3/2013 | Alexander | H02M 3/1582 363/123 |
| 8,424,769 | B2* | 4/2013 | Kato | H01Q 1/2216 235/487 |
| 8,432,064 | B2* | 4/2013 | Maeda | H02J 7/34 307/44 |
| 8,436,590 | B2* | 5/2013 | Funaba | B60K 6/445 307/109 |
| 8,446,051 | B2* | 5/2013 | Luthi | H02J 9/005 307/130 |
| 8,461,915 | B2* | 6/2013 | Huang | H02M 1/126 323/901 |
| 8,466,668 | B2* | 6/2013 | Cross | H02M 1/36 323/282 |
| 8,471,626 | B2* | 6/2013 | Huang | H02M 1/126 323/901 |
| 8,493,056 | B2* | 7/2013 | Barnett | G01R 15/16 324/76.11 |
| 8,576,022 | B2* | 11/2013 | Chikando | H03H 7/0153 333/17.1 |
| 8,593,837 | B2* | 11/2013 | Hong | G03G 15/5004 320/166 |
| 8,624,432 | B2* | 1/2014 | Maeda | H02J 7/34 307/44 |
| 8,624,562 | B2* | 1/2014 | Balakrishnan | H02M 1/32 320/166 |
| 8,643,222 | B2* | 2/2014 | Brinlee | H02M 3/33507 307/140 |
| 8,648,631 | B2* | 2/2014 | Latal | H02M 3/156 327/142 |
| 8,669,758 | B2* | 3/2014 | Barnett | G01R 15/16 324/76.11 |
| 8,675,379 | B2* | 3/2014 | Smolenski | H02M 7/003 363/132 |
| 8,686,694 | B2* | 4/2014 | Funaba | B60K 6/445 307/109 |
| 8,710,804 | B2* | 4/2014 | Ptacek | H02M 1/126 307/109 |
| 8,710,806 | B2* | 4/2014 | Moon | H02M 1/36 320/166 |
| 8,724,277 | B2* | 5/2014 | Baba | H04N 5/63 307/126 |
| 8,761,631 | B2* | 6/2014 | Shimura | G03G 15/80 399/67 |
| 8,836,289 | B2* | 9/2014 | Flett | H02P 27/08 318/400.26 |
| 8,848,321 | B2* | 9/2014 | Halberstadt | H02M 3/155 361/18 |
| 8,860,397 | B2* | 10/2014 | Louvel | H02M 7/2176 323/237 |
| 8,873,991 | B2* | 10/2014 | Inukai | H02M 1/32 399/69 |
| 8,880,911 | B2* | 11/2014 | Karino | H02J 1/14 713/300 |
| 8,890,630 | B2* | 11/2014 | Hughes | H03B 5/04 331/108 D |
| 8,897,037 | B2* | 11/2014 | Lin | H02M 3/33507 363/125 |
| 8,917,115 | B2* | 12/2014 | Gonzalez Moreno | G01R 19/175 327/78 |
| 8,937,471 | B2* | 1/2015 | Kobayashi | H02M 1/32 320/166 |
| 8,953,341 | B2* | 2/2015 | Fahlenkamp | H02M 3/33523 363/21.01 |
| 8,953,347 | B2* | 2/2015 | Jin | H02M 1/32 363/44 |
| 8,988,910 | B2* | 3/2015 | Hsu | H02M 7/04 363/126 |
| 9,048,746 | B2* | 6/2015 | Luthi | H02M 1/36 |
| 9,059,585 | B2* | 6/2015 | Lee | H02H 7/16 |
| 9,065,340 | B2* | 6/2015 | Balakrishnan | H02M 1/32 |
| 9,077,248 | B2* | 7/2015 | Brinlee | H02M 1/36 |
| 9,136,753 | B2* | 9/2015 | Luthi | H02M 1/36 |
| 9,148,049 | B2* | 9/2015 | Li | H02M 1/36 |
| 9,192,001 | B2* | 11/2015 | Stepps | H05B 33/0809 |
| 9,203,296 | B2* | 12/2015 | Fauer | H02M 1/10 |
| 9,225,232 | B2* | 12/2015 | Liu | H02M 1/32 |
| 9,246,402 | B2* | 1/2016 | Sakurai | H02M 7/217 |
| 9,263,939 | B2* | 2/2016 | Jin | H02H 3/14 |
| 9,270,163 | B2* | 2/2016 | Shimura | G03G 15/80 |
| 9,274,491 | B2* | 3/2016 | Matsumoto | H02M 1/126 |
| 9,304,478 | B2* | 4/2016 | Hayasaki | G03G 15/80 |
| 9,318,944 | B2* | 4/2016 | Royak | H02M 7/797 |
| 9,329,561 | B2* | 5/2016 | Hayasaki | G03G 15/80 |
| 9,374,019 | B2* | 6/2016 | Li | H02M 7/219 |
| 9,389,263 | B2* | 7/2016 | Sartler | G01R 31/028 |
| 9,397,553 | B2* | 7/2016 | Jung | H02M 1/36 |
| 9,397,580 | B1* | 7/2016 | Alexander | H02M 3/1582 |
| 9,401,592 | B2* | 7/2016 | Lee | H02H 9/005 |
| 9,419,511 | B2* | 8/2016 | Huang | H02M 3/33507 |
| 9,431,845 | B2* | 8/2016 | Xu | H02J 7/007 |
| 9,455,621 | B2* | 9/2016 | Lund | G01R 19/175 |
| 9,473,015 | B2* | 10/2016 | Harada | H02M 1/36 |
| 9,484,798 | B2* | 11/2016 | Kim | H02M 7/12 |
| 9,488,686 | B2* | 11/2016 | Bhandarkar | G01R 31/028 |
| 9,490,690 | B2* | 11/2016 | Bhandarkar | H02M 7/219 |
| 9,537,307 | B2* | 1/2017 | Sagona | H02H 9/041 |
| 9,537,417 | B2* | 1/2017 | Shiroyama | G01R 31/40 |
| 9,537,418 | B2* | 1/2017 | Hsu | H02M 7/06 |
| 9,543,842 | B2* | 1/2017 | Jovcic | H02M 3/33584 |
| 9,559,527 | B2* | 1/2017 | Jeong | H02J 3/00 |
| 9,590,513 | B2* | 3/2017 | Fahlenkamp | H02M 3/33523 |
| 9,664,714 | B2* | 5/2017 | Chen | G01R 19/0007 |
| 9,667,080 | B2* | 5/2017 | Ishii | H02J 7/0052 |
| 9,715,204 | B2* | 7/2017 | Kim | G03G 15/5004 |
| 9,735,665 | B2* | 8/2017 | Balakrishnan | H02M 1/32 |
| 9,735,696 | B2* | 8/2017 | Bhandarkar | H02M 5/458 |
| 2001/0022510 | A1* | 9/2001 | Okamura | H02J 7/0016 320/166 |
| 2001/0028571 | A1* | 10/2001 | Hanada | H02H 9/001 363/50 |
| 2005/0248968 | A1* | 11/2005 | Chang | H02M 1/4225 363/125 |
| 2007/0096564 | A1* | 5/2007 | Maeda | H02J 7/34 307/87 |
| 2007/0252664 | A1* | 11/2007 | Saitoh | H04B 3/56 333/175 |
| 2008/0013351 | A1* | 1/2008 | Alexander | H02M 3/1582 363/123 |
| 2008/0018261 | A1* | 1/2008 | Kastner | F21V 23/00 315/192 |
| 2008/0116902 | A1* | 5/2008 | Kim | H04B 1/30 324/601 |

(56) References Cited

U.S. PATENT DOCUMENTS

| | | | |
|---|---|---|---|
| 2008/0136376 A1* | 6/2008 | Nebrigic | H02J 7/0022 320/136 |
| 2008/0246459 A1* | 10/2008 | Ingman | H03H 7/427 323/355 |
| 2009/0051331 A1* | 2/2009 | Gerber | G05F 3/30 320/166 |
| 2009/0196079 A1* | 8/2009 | Nathan | H02M 1/32 363/50 |
| 2009/0260668 A1* | 10/2009 | Maeda | H02J 7/34 136/205 |
| 2009/0302816 A1* | 12/2009 | Kunimatsu | H02M 1/36 323/282 |
| 2010/0008117 A1* | 1/2010 | Luthi | H02J 9/005 363/126 |
| 2010/0033882 A1* | 2/2010 | Skatulla | H02M 1/36 361/18 |
| 2010/0166449 A1* | 7/2010 | Hong | G03G 15/5004 399/88 |
| 2010/0225170 A1* | 9/2010 | Hjort | H02J 7/0047 307/65 |
| 2010/0308655 A1* | 12/2010 | Wachi | H02M 1/36 307/31 |
| 2010/0309694 A1* | 12/2010 | Huang | H02M 1/126 363/49 |
| 2010/0321104 A1* | 12/2010 | Busch | H02M 1/12 327/552 |
| 2010/0321964 A1* | 12/2010 | Brinlee | H02M 3/33507 363/21.18 |
| 2011/0025278 A1* | 2/2011 | Balakrishnan | H02M 1/32 320/166 |
| 2011/0101775 A1* | 5/2011 | Busch | H02J 9/005 307/18 |
| 2011/0128087 A1* | 6/2011 | Chikando | H03H 7/0153 333/17.1 |
| 2011/0176341 A1* | 7/2011 | Huang | H02M 1/126 363/49 |
| 2011/0227415 A1* | 9/2011 | Hjort | H02J 7/0047 307/66 |
| 2011/0279108 A1* | 11/2011 | Barnett | G01R 15/16 324/76.11 |
| 2011/0279163 A1* | 11/2011 | Barnett | G01R 15/16 327/324 |
| 2011/0280053 A1* | 11/2011 | Halberstadt | H02M 3/155 363/126 |
| 2011/0310519 A1* | 12/2011 | Baba | H04N 5/63 361/91.1 |
| 2012/0014151 A1* | 1/2012 | Alexander | H02M 5/225 363/123 |
| 2012/0020131 A1* | 1/2012 | Chan | H02J 9/005 363/126 |
| 2012/0044723 A1* | 2/2012 | Lin | H02M 3/33507 363/21.13 |
| 2012/0051100 A1* | 3/2012 | Alexander | H02M 3/1582 363/37 |
| 2012/0080947 A1* | 4/2012 | Karino | H02J 1/14 307/31 |
| 2012/0105016 A1* | 5/2012 | Moon | H02M 1/36 320/166 |
| 2012/0105018 A1* | 5/2012 | Balakrishnan | H02M 1/32 320/166 |
| 2012/0112564 A1* | 5/2012 | Wu | H02M 1/44 307/326 |
| 2012/0134185 A1* | 5/2012 | Shin | H02M 7/46 363/44 |
| 2012/0188794 A1* | 7/2012 | Chang | H02M 3/33507 363/16 |
| 2012/0207505 A1* | 8/2012 | Kobayashi | H02M 1/32 399/88 |
| 2012/0287684 A1* | 11/2012 | Fahlenkamp | H02M 3/33523 363/49 |
| 2012/0294048 A1* | 11/2012 | Brinlee | H02M 1/36 363/21.18 |
| 2012/0319501 A1* | 12/2012 | Luthi | H02M 1/36 307/109 |
| 2013/0027087 A1* | 1/2013 | Latal | H02M 3/156 327/63 |
| 2013/0027999 A1* | 1/2013 | Ptacek | H02M 1/126 363/126 |
| 2013/0033236 A1* | 2/2013 | Li | H02M 7/219 320/166 |
| 2013/0039103 A1* | 2/2013 | Smolenski | H02M 7/003 363/123 |
| 2013/0049706 A1* | 2/2013 | Huang | H02M 1/32 320/166 |
| 2013/0057231 A1* | 3/2013 | Luthi | H02M 1/36 323/210 |
| 2013/0076315 A1* | 3/2013 | Liu | H02M 1/32 320/166 |
| 2013/0077364 A1* | 3/2013 | Urienza | H02M 7/2176 363/84 |
| 2013/0114313 A1* | 5/2013 | Jung | H02M 1/36 363/49 |
| 2013/0129373 A1* | 5/2013 | Inukai | H02M 1/32 399/88 |
| 2013/0147440 A1* | 6/2013 | Shiroyama | G01R 31/40 320/166 |
| 2013/0148998 A1* | 6/2013 | Shimura | G03G 15/80 399/88 |
| 2013/0162235 A1* | 6/2013 | Harada | H02M 3/156 323/283 |
| 2013/0170261 A1* | 7/2013 | Lee | H02H 7/16 363/126 |
| 2013/0188401 A1* | 7/2013 | Jin | H02H 3/14 363/21.17 |
| 2013/0188405 A1* | 7/2013 | Jin | H02M 1/32 363/49 |
| 2013/0193910 A1* | 8/2013 | Kitamine | H02J 7/0052 320/107 |
| 2013/0195497 A1* | 8/2013 | Shimura | G03G 15/80 399/88 |
| 2013/0221895 A1* | 8/2013 | Kanda | H02M 1/12 318/767 |
| 2013/0234519 A1* | 9/2013 | Maeda | H02J 7/34 307/64 |
| 2013/0235627 A1* | 9/2013 | Huang | H02M 1/126 363/44 |
| 2013/0242626 A1* | 9/2013 | Li | H02M 1/36 363/50 |
| 2013/0271184 A1* | 10/2013 | Gonzalez Moreno | H03K 5/1536 327/68 |
| 2013/0300387 A1* | 11/2013 | Louvel | H02M 7/2176 323/282 |
| 2013/0335038 A1* | 12/2013 | Lee | H02M 1/126 320/166 |
| 2014/0029320 A1* | 1/2014 | Alexander | H02M 5/225 363/123 |
| 2014/0036561 A1* | 2/2014 | Sakurai | H02M 7/217 363/126 |
| 2014/0062421 A1* | 3/2014 | Jeong | H02J 3/00 320/166 |
| 2014/0097788 A1* | 4/2014 | Kim | H02J 7/007 320/107 |
| 2014/0097803 A1* | 4/2014 | Balakrishnan | H02M 1/32 320/166 |
| 2014/0152243 A1* | 6/2014 | Xu | H02J 7/007 320/107 |
| 2014/0159661 A1* | 6/2014 | Weissenborn | H02J 7/0003 320/109 |
| 2014/0169047 A1* | 6/2014 | Hsu | H02M 7/04 363/44 |
| 2014/0184145 A1* | 7/2014 | Degen | H03K 5/14 320/107 |
| 2014/0198534 A1* | 7/2014 | Jovcic | H02M 3/33584 363/16 |
| 2014/0239712 A1* | 8/2014 | Yoon | B60L 1/00 307/10.1 |

(56) References Cited

U.S. PATENT DOCUMENTS

| | | | | |
|---|---|---|---|---|
| 2014/0239899 A1* | 8/2014 | Tsai | ............... | H02J 7/007 320/118 |
| 2014/0254210 A1* | 9/2014 | Hayasaki | ............... | G03G 15/80 363/21.12 |
| 2014/0266507 A1* | 9/2014 | Fauer | ............... | H02M 1/10 333/181 |
| 2014/0307486 A1* | 10/2014 | Huang | ............... | H02M 3/33507 363/21.16 |
| 2015/0022162 A1* | 1/2015 | Kim | ............... | G03G 15/5004 320/166 |
| 2015/0049520 A1* | 2/2015 | Xu | ............... | H02M 1/32 363/21.02 |
| 2015/0062974 A1* | 3/2015 | Lund | ............... | G01R 19/175 363/21.04 |
| 2015/0109834 A1* | 4/2015 | Hsu | ............... | H02M 7/04 363/44 |
| 2015/0117075 A1* | 4/2015 | Matsumoto | ............... | H02M 1/126 363/126 |
| 2015/0138847 A1* | 5/2015 | Fahlenkamp | ............... | H02M 3/33523 363/21.04 |
| 2015/0146331 A1* | 5/2015 | Lee | ............... | H02H 1/0007 361/56 |
| 2015/0180324 A1* | 6/2015 | Hsu | ............... | H02M 7/06 363/89 |
| 2015/0180349 A1* | 6/2015 | Hayasaki | ............... | G03G 15/80 399/88 |
| 2015/0233979 A1* | 8/2015 | Barrenscheen | ............... | G01R 19/16547 324/120 |
| 2015/0241503 A1* | 8/2015 | Bhandarkar | ............... | G01R 31/028 363/44 |
| 2015/0256059 A1* | 9/2015 | Balakrishnan | ............... | H02M 1/32 320/166 |
| 2015/0263542 A1* | 9/2015 | Sato | ............... | H02J 7/007 363/21.12 |
| 2015/0263600 A1* | 9/2015 | Bhandarkar | ............... | H02M 7/219 363/44 |
| 2015/0297046 A1* | 10/2015 | Roth | ............... | A47L 5/00 15/339 |
| 2015/0340890 A1* | 11/2015 | Yao | ............... | H02J 7/0042 320/114 |
| 2015/0355259 A1* | 12/2015 | Sartler | ............... | G01R 31/028 324/548 |
| 2015/0357857 A1* | 12/2015 | Flock | ............... | B60L 3/04 318/504 |
| 2016/0006341 A1* | 1/2016 | Mao | ............... | H02M 1/08 363/21.17 |
| 2016/0036249 A1* | 2/2016 | Saji | ............... | H02M 3/33507 320/160 |
| 2016/0129795 A1* | 5/2016 | Chizuwa | ............... | B60L 11/1816 320/109 |
| 2016/0164428 A1* | 6/2016 | Chen | ............... | G01R 19/0007 307/130 |
| 2016/0241135 A1* | 8/2016 | Zhao | ............... | H02M 1/44 |
| 2016/0329727 A1* | 11/2016 | Li | ............... | H02M 7/219 |
| 2017/0012543 A1* | 1/2017 | Lund | ............... | G01R 19/175 |
| 2017/0019016 A9* | 1/2017 | Huang | ............... | H02M 1/126 |
| 2017/0149343 A1* | 5/2017 | Bhandarkar | ............... | H02M 1/08 |

FOREIGN PATENT DOCUMENTS

| | | |
|---|---|---|
| CN | 202856607 U | 4/2013 |
| CN | 203445787 U | 2/2014 |
| CN | 203607871 U | 5/2014 |

\* cited by examiner

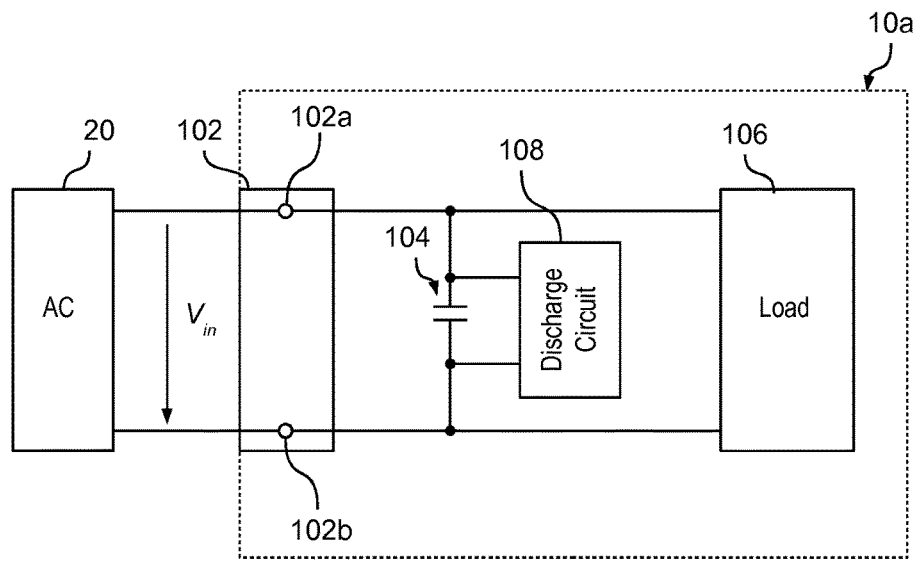
Fig. 1a *(Prior Art)*
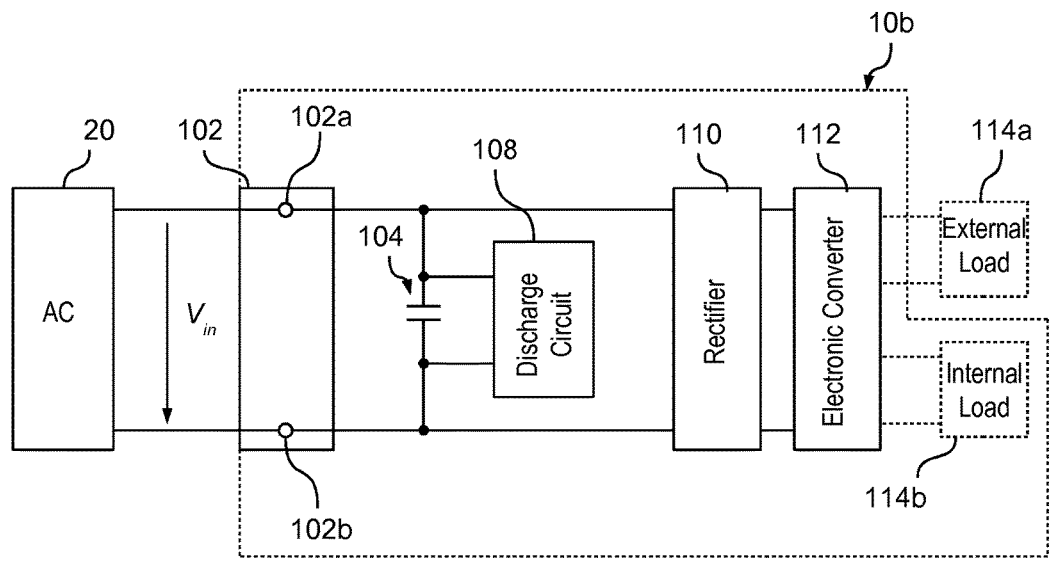
Fig. 1b *(Prior Art)*

| L | DT₁ | DT₂ |
|---|---|---|
| 7 | 386 | |
| 6 | | 330 |
| 6 | 282 | |
| 5 | | 241 |
| 5 | 206 | |
| 4 | | 176 |
| 4 | 151 | |
| 3 | | 129 |
| 3 | 110 | |
| 2 | | 94 |
| 2 | 80 | |
| 1 | | 69 |
| 1 | 59 | |
| 0 | | 50 |
| 0 | 43 | |

DETECTION CIRCUIT FOR AN ACTIVE DISCHARGE CIRCUIT OF AN X-CAPACITOR, RELATED ACTIVE DISCHARGE CIRCUIT, INTEGRATED CIRCUIT AND METHOD

BACKGROUND

Technical Field

Embodiments of the present disclosure relate to circuits for discharging an X capacitor.

Description of the Related Art

FIG. 1a shows an example of a device 10a being powered via an input voltage $V_{in}$ provided by an external AC power supply source 20, such as the mains having, e.g., 230 VAC or 110 VAC. For example, typically the device 10a includes a connector 102, such as a plug, comprising two terminals 102a and 102b for connection to the external AC power source 20 and the AC power supply signal $V_{in}$ received via the connector 102 is provided to some kind of electric load 106.

The device 10a may also include a capacitor 104 directly connected to the AC input connector 102, which is usually called X-capacitor or X-cap. For example, such X-capacitors are often used in switched mode power supplies (SMPS).

FIG. 1b shows in this respect an example of a typical switched mode power supply 10b. Specifically, in the example considered, the electric load 106 of FIG. 1a is now represented by a rectifier circuit 110, such as a diode bridge rectifier, configured to convert the AC power supply signal $V_{in}$ into a DC power supply signal, and an electronic converter 112, such as a DC/DC switching converter, which may feed a load 114, such as an external load 114a and/or an internal load 114b. For example, in this case, the capacitor 104 may be configured to filter EMI (electromagnetic interference) noise coming from the switching activity of the switching converter 112.

Safety regulations, such as the international standard IEC60950, may require that such devices 10a and 10b, indicated in the following simply as device 10, include a discharge circuit 108 configured to discharge the capacitor 104, when the connector 102 is disconnected from the AC power source 20, thus reducing the risk of electric shocks in case a user touches the connector 102 of a disconnected device 10. For example, usually such discharge circuits 108 are required when the capacitance of the capacitor 104 is greater than a given value, such as 0.1 µF.

For example, often a device 10 is considered to be compliant with the technical regulation when the discharge circuit 108 may discharge such an X-capacitor 104 (and possible other capacitances connected between the power supply lines feeding the load 106) with a given maximum discharge time constant. For example, often the discharge time constant is calculated as the effective capacitance (µF) connected to the connector 102 multiplied by the effective resistance of the discharge path of the discharge circuit 108. Whenever these values cannot be easily defined, the effectiveness of the discharge circuit 108 is often evaluated by the measure of the time needed to reduce the voltage at the capacitor 104 down to, e.g., 0.37 times the initial value. For example, typically the discharge time constant should be lower than 1 second for "type A" equipment with AC plug connection, or 10 seconds for permanent installed equipment and "type B" equipment with AC plug connection.

For example, the discharge circuit 108 may comprise a resistor connected in parallel with the capacitor 104. In this case, the resistance of the resistor could be dimensioned in order to discharge the capacitor 104 according to the applicable safety regulations.

The drawback of this solution resides in the fact that such an additional resistor also consumes power when the device 10 is connected to the AC power source 20, thereby reducing the efficiency of the device 10.

This problem may be particularly relevant for switched mode power supplies as shown, e.g., in FIG. 1b.

In fact, such switched mode power supply 10b could also be connected to the AC power source 20, when the load 114 is disconnected, switched off or in a low power mode, such as a standby mode. For example, this may apply to a notebook adapter connected to the AC mains when the notebook (represented in this case by external load 114a) is disconnected or switched off. In this case the consumption of the resistor may represent a considerable part of the adapter power consumption.

In order to overcome this problem, the discharge circuit 108 may also be an active discharge circuit, which discharges the capacitor 104 only when the connector 102 is disconnected from the AC power source 20, thereby reducing the power consumption of the discharge circuit 108 when the device 10 is connected to the AC power source 20.

BRIEF SUMMARY

The inventors have observed that one part of such an active discharge circuit is the detection circuit used to detect a disconnection from and/or connection to the AC power source.

The present disclosure provides arrangements which permit improvement of this detection.

According to one or more embodiments, a detection circuit for an active discharge circuit of an X-capacitor has the features specifically set forth in the claims that follow. The present disclosure also relates to a related active discharge circuit and integrated circuit comprising the detection circuit, and a related method.

The claims are an integral part of the technical teaching of the embodiments provided herein.

As mentioned in the forgoing, the detection circuit is part of an active discharge circuit that is used to discharge an X capacitor of a device, in particular a switched mode power supply. Generally, the detection circuit is configured to generate a discharge enable signal signaling the presence or absence of an AC oscillation applied to said X capacitor.

In some embodiments, the detection circuit comprises a sensor circuit, such as a voltage divider with associated rectifier circuit, for connection to the X capacitor. In particular, this sensor circuit is configured to generate a sensor signal being indicative of the voltage at the X capacitor, such as a scaled down version and/or rectified version of the voltage at the X capacitor.

In some embodiments, the detection circuit comprises a comparator circuit comprising one or more comparators. Accordingly, the comparator circuit generates at least one comparison signal by comparing the sensor signal with at least one threshold.

In some embodiments, the detection circuit comprises a timer circuit, such as a digital counter, configured to determine whether a given time has lapsed since the last reset event and set the discharge enable signal accordingly. For example, the time circuit may set the discharge enable signal to a first logic level when the timer circuit is reset via a reset signal. Next, the timer circuit may determine the time elapsed since the timer circuit has been reset and in case the time elapsed exceeds a given timeout value, the timer circuit may set the discharge enable signal to a second logic level.

In some embodiments, an elaboration circuit is used to generate this reset signal for the timer circuit as a function of the at least one comparison signal provided by the comparison circuit.

In some embodiments, the detection circuit comprises also a dynamic threshold generator circuit configured to vary the at least one threshold of the comparator circuit as a function of the sensor signal.

For example, in some embodiments, the dynamic threshold generator circuit is configured to vary the at least one threshold of the comparator circuit in a feed-forward manner directly as a function of the sensor signal.

For example, in this case, the dynamic threshold generator circuit may comprise a peak detector circuit configured to determine an upper threshold or peak value of the sensor signal, and a threshold generator circuit configured to determine a lower threshold value as a function of this upper threshold value.

In this case, the comparator circuit may determine whether the sensor signal is greater than the lower threshold value, or alternatively between the lower and the upper threshold value. Accordingly, a raising edge in the signal at the output of the comparator indicates that the sensor signal has a positive slope, while a falling edge in the signal at the output of the comparator indicates that the sensor signal has a negative slope.

In some embodiments, the elaboration circuit may therefore reset the timer circuit when the comparison signal comprises a leading and/or a falling edge. The elaboration circuit may also determine the time elapsed between a leading and a falling edge, and reset the timer circuit when this time is smaller than a given time threshold value.

In some embodiments, the dynamic threshold generator circuit may vary the at least one threshold of the comparator circuit also in a feed-back manner as a function of the at least one comparison signal at the output of the comparator circuit.

For example, in this case, the comparator circuit may comprise two comparators which generate a first and a second comparison signal indicating whether the sensor signal is greater than a first and a second threshold value, respectively. Accordingly, the comparison signals indicate whether the sensor signal is smaller than, between or greater than the first and a second threshold value.

In some embodiments, the dynamic threshold generator circuit may thus increase the smaller one of the first or the second threshold values, when the sensor signal is greater than both the first and the second threshold values, or decrease the greater one of the first or the second threshold values, when the sensor signal is smaller than both the first and the second threshold value, i.e., the threshold values are always adapted such that the sensor signal is between the first and the second threshold value. Accordingly, the smaller threshold value is increased due to a positive slope in the sensor signal, while the greater threshold value is decreased due to a negative slope in the sensor signal.

This behavior may be used to reset the timer circuit. For example, in some embodiments, the elaboration circuit resets the timer circuit each time the smaller threshold value is increased, i.e., each time the comparator circuit indicates that the sensor signal is greater than both threshold values.

Accordingly, the detection circuit generally determines the presence of an AC voltage between two terminals, which are usually connected to the X-capacitor of a device, such as a switched mode power supply. Accordingly, such a detection circuit is particularly useful in an active discharge circuit adapted to discharge such an X capacitor.

Generally, the detection circuit or the complete active discharge circuit may also be integrated in a digital and/or analog integrated circuit, for example the driver circuit of a switched mode power supply.

BRIEF DESCRIPTION OF THE SEVERAL VIEWS OF THE DRAWINGS

Embodiments of the present disclosure will now be described with reference to the annexed drawings, which are provided purely by way of non-limiting example and in which:

FIGS. 1a and 1b are functional diagrams of devices including conventional discharge circuits;

DETAILED DESCRIPTION

In the following description, numerous specific details are given to provide a thorough understanding of embodiments of the present disclosure. The embodiments can be practiced without one or several of these specific details, or with other methods, components, materials, etc. In other instances, well-known structures, materials, or operations are not shown or described in detail to avoid obscuring aspects of the described embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and should not limit the scope or meaning of the embodiments.

In the following figures parts, elements or components which have already been described with reference to FIG. 1 are denoted by the same references previously used in such figure. The description of such previously described elements will not be repeated in the following in order not to overburden the present detailed description.

As mentioned in the foregoing, the present disclosure provides solutions for discharging an X-capacitor.

Figure 2:
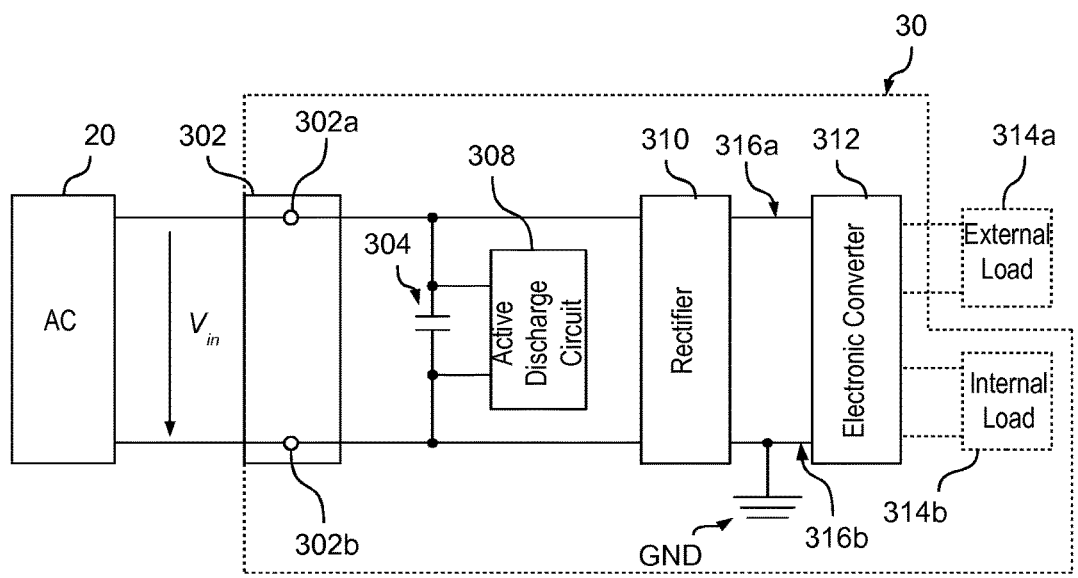
FIG. 2 shows a device comprising an X-capacitor in accordance with one embodiment of the present disclosure.

FIG. 2 shows an embodiment of a device 30 in accordance with the present disclosure.

Similar to the devices shown in FIGS. 1a and 1b, the device 30 includes a connector 302, such as a plug, comprising at least two power supply terminals 302a and 302b for connection to the external AC power supply 20 and the AC power supply signal $V_{in}$ received via the terminals 302a and 302b is provided to a load.

For example, in an embodiment, the AC power supply signal received via the terminals 302a and 302b is provided to a rectifier 310, such as a bridge rectifier, which converts the AC power supply signal in a DC power signal, which is provided via a positive power line 316a and a negative power line 316b, which represents a ground GND, to a DC load 312.

For example, in an embodiment, the DC load may be a DC/DC or DC/AC switching converter 312, which provides a regulated power supply signal to an external and/or internal load indicated with the reference signs 314a and 314b, respectively. For example, typical topologies for switching converters are buck, boost, buck-boost, flyback, forward, half-bridge or full-bridge converters, which are well known to those skilled in the art, rendering a detailed description herein unnecessary.

In the embodiment considered, the device 30 also includes an X-capacitor 304, i.e., at least one capacitor being connected (e.g., directly) between the terminals 302a and 302b.

In the embodiment considered, the device 10 comprises further an active discharge circuit 308 configured to selectively discharge the capacitor 304.

Figure 3:
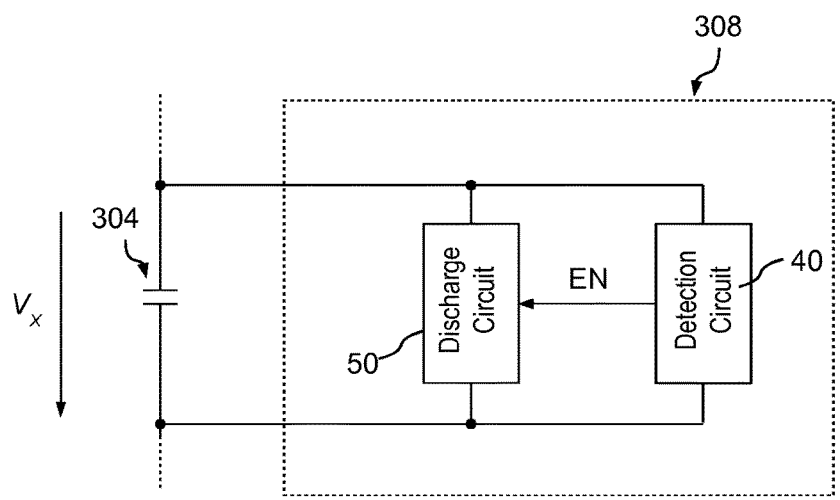
FIG. 3 shows an embodiment of an active discharge circuit for the device of FIG. 2.

FIG. 3 shows an embodiment of an active discharge circuit 308 in accordance with one embodiment of the present disclosure.

Specifically, in the embodiment considered, the active discharge circuit 308 comprises a detection circuit 40 configured to determine whether the connector 302 has been disconnected from the AC power source 20 and a discharge circuit 50 driven via a signal EN provided by the detection circuit 40 and configured to discharge the capacitor 304 when the signal EN indicates that the connector 302 has been disconnected from the AC power source 20.

Generally, when the device 30 is connected to the AC voltage source 20, the voltage $V_X$ at the capacitor 304, i.e., the voltage between the terminals 302a and 302b, is a sinusoidal signal, i.e., an oscillation having a given amplitude and frequency, e.g., an amplitude of 230V and a frequency of 50 Hz.

Thus, by detecting an AC oscillation at the capacitor 304, the detection circuit 40 may determine whether the device 30 is connected to the AC power source 20 or not.

Figure 4:
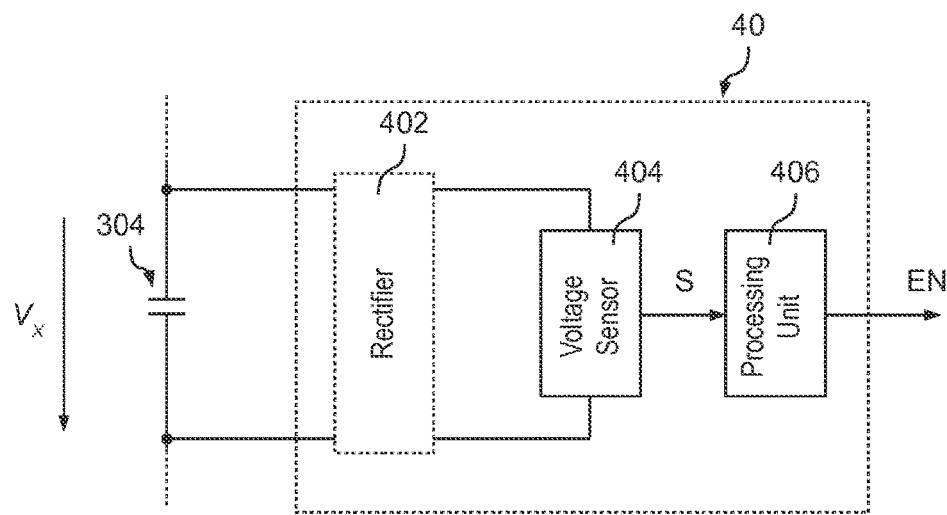
FIG. 4 shows an embodiment of a detection circuit for the active discharge circuit of FIG. 3.

FIG. 4 shows a possible embodiment of the detection circuit 40.

In the embodiment considered, the detection circuit 40 comprises an optional rectifier circuit 402, a voltage sensor 404 and a processing unit 406.

Specifically, the optional rectifier circuit 402 is interposed between the capacitor 304 and the voltage sensor 404, wherein the rectifier circuit 402 is configured to convert the AC voltage signal $V_X$ at the capacitor 104 into a DC voltage signal.

Conversely, the voltage sensor 404 is configured to measure the voltage at the output of the rectifier circuit 402 (or in alternative directly at the capacitor 304). Accordingly, generally, a signal S provided at the output of the voltage sensor 404 is representative of the voltage $V_X$ at the capacitor 304.

Figures 13, 14:
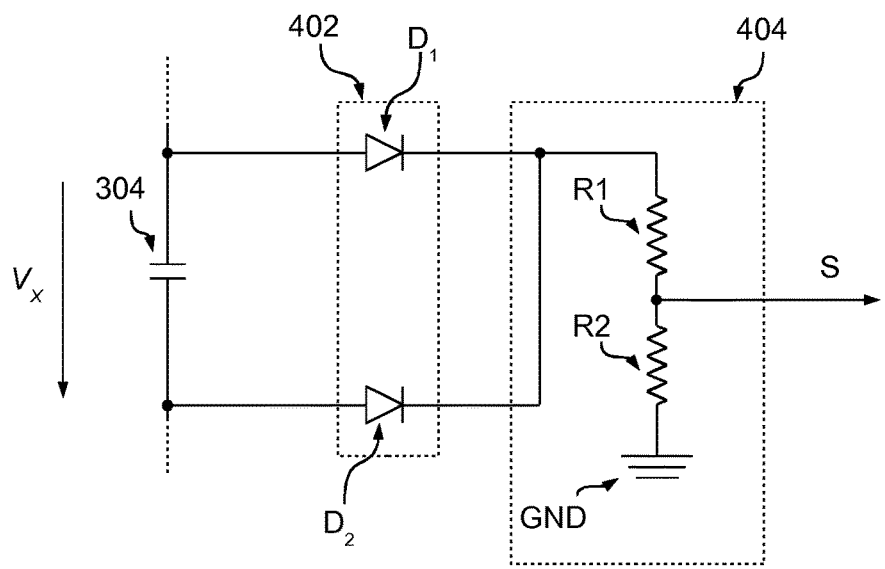
FIGS. 14 and 15 show further details of embodiments of the active discharge circuit of FIG. 3.

For example, FIG. 14 shows a possible embodiment of the voltage sensor 404, which is particularly suitable for devices comprising already a rectifier 310, such as a bridge rectifier.

In the embodiment considered, the voltage $V_X$ at the capacitor 304 is rectified via a rectifier circuit 402. Specifically, in the embodiment considered, the rectifier comprises two diodes $D_1$ and $D_2$. More specifically, the anode of the diode D1 is connected to a first terminal of the capacitor 304, e.g., to the terminal 302a, and the anode of the diode D2 is connected to the second terminal of the capacitor 304, e.g., to the terminal 302b. The cathodes of the diodes $D_1$ and $D_2$ are connected (preferably directly) together and provide thus always a positive voltage. In particular, merely two diodes $D_1$ and $D_2$ are sufficient, because the ground GND provided by the rectifier 310 may be used as negative reference for this voltage.

Conversely, e.g., in case the rectifier 310 is missing, a full bridge rectifier could be used in the rectifier circuit 402.

The positive voltage provided at the cathodes of the $D_1$ and $D_2$ is provided to the voltage sensor 404.

For example, in the embodiment considered, a voltage divider comprising two resistors R1 and R2 connected in series is used as voltage sensor 404. Specifically, in the embodiment considered the voltage divider is connected between the connection point of the cathodes of the diodes $D_1$ and $D_2$ and the ground GND, and the intermediate point between the resistors R1 and R2 provides the sensor signal S. Accordingly, in the embodiment considered, the signal S corresponds to a positive voltage with respect to the ground GND and corresponds to a rectified and scaled down version of the voltage $V_X$ at the capacitor 304.

Thus, when the device 30 is connected to the AC power source 20 the signal S may have different waveforms which primarily depend on the presence and implementation of the rectifier circuit 402. For example, generally, the signal S may be an AC sinusoidal oscillation, a positive sinusoidal oscillation (e.g., by adding a DC offset to the AC oscillation), a rectified sinusoidal oscillation, or a waveform comprising only each second half-wave (e.g., by using only a single diode, e.g., diode $D_1$ or $D_2$, in the rectifier circuit 402).

Finally, the processing unit 406, which may be implemented by any suitable analog and/or digital circuit, elaborates the sensor signal S and determines the signal EN as a function of the sensor signal S.

Generally, the discharge circuit 50 (FIG. 3) includes at least one electronic switch SW configured to selectively discharge the capacitor 304 as a function of the signal EN. In order to limit the discharge current, a resistor, or generally a resistive element R, or a current generator I (generating a linear/non-linear current and/or a constant/non-constant current) could also be connected in series with such an electronic switch SW, as represented through the dashed line depictions of these elements in FIG. 15. The discharge circuit 50 may include the electronic switch SW connected to the resistive element R and/or the current generator I. Accordingly, such an electronic switch SW could be connected, e.g., in parallel with the capacitor 304.

Conversely, if the device 30 includes a rectifier 310, the electronic switch SW could also discharge the capacitor 304 to ground GND.

Figure 15:
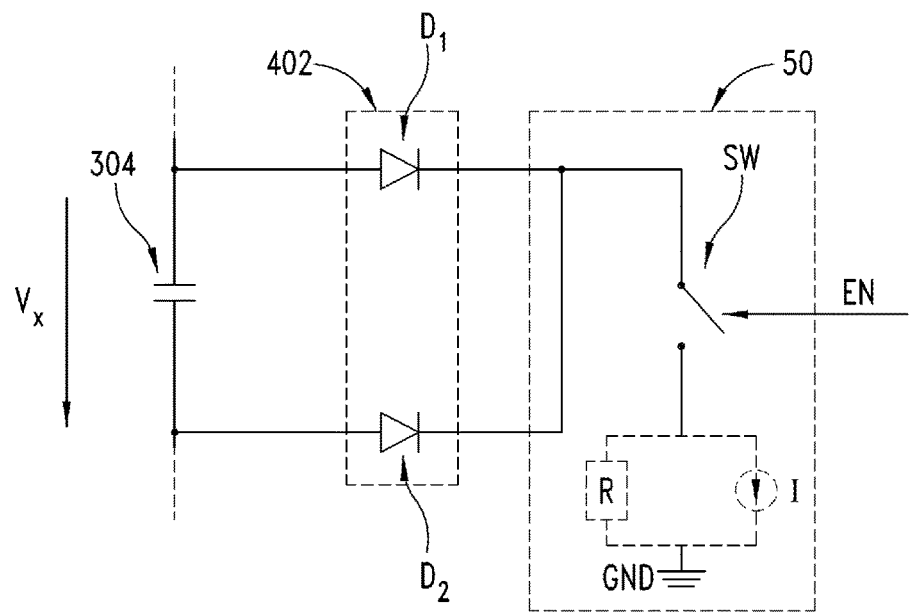

For example, FIG. 15 shows an embodiment of the discharge circuit 50 which may be used in combination with the voltage sensor 404 shown in FIG. 14. In fact, in this embodiment, the connection point of the cathodes of the diodes $D_1$ and $D_2$ always provides a positive voltage with respect to the ground GND, i.e., the negative line at the output of the rectifier 310. Accordingly, in this case an electronic switch SW, such as a metal-oxide-semiconductor field-effect transistor (MOSFET), e.g., with n channel, may be connected between the connection point of the cathodes of the diodes $D_1/D_2$ and ground GND, wherein the control gate of the electronic switch SW is driven via the signal EN.

Generally, also in this case a disconnection event should not be detected by simply checking whether the signal S is greater than a given threshold, because when the connector 302 (FIG. 3) is disconnected, the capacitor 304 may be charged to any value between zero and the maximum line voltage. Therefore the use of a constant fixed threshold is not a reliable way to implement the detection.

Moreover, detection is complex also because possible further components of an EMI filter placed upstream the connector 302 could introduce distortions in the sensed voltage S. Furthermore, often it is also not possible to exactly predict the distortion, which often depends on the operative conditions of the electric load of the device.

Finally, in particular in the context of switched mode power supplies, the sensor signal S could also not decrease gradually when the device 30 is disconnected, but the subsequent electronic converter 310 could still consume energy leading to voltage profiles similar to a linear or step-down slow discharge.

Figure 5A:
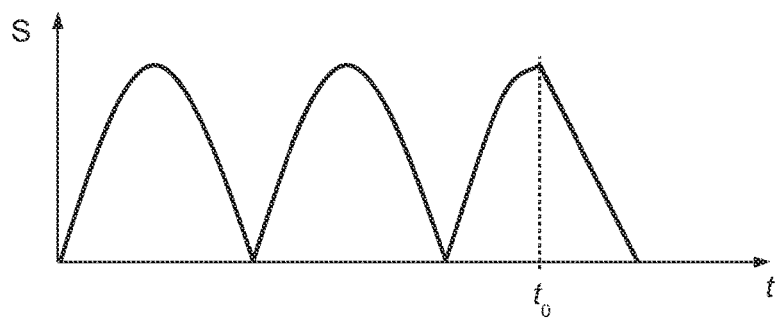
FIGS. 5a and 5b show typical waveforms occurring in the detection circuit of FIG. 4.
Figure 5B:
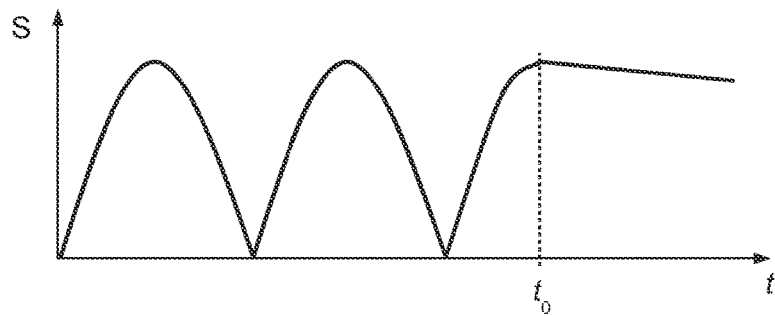

For example, FIGS. 5a and 5b show two possible waveforms of the signal S, in the case of a switched mode power supply with or without output load, respectively.

Specifically, in the examples considered, once the plug is disconnected at a time $t_0$, the discharge time of the capacitor 304 varies significantly between the waveforms shown in FIGS. 5a and 5b. For example, the discharge behavior shown in FIG. 5a is quite similar to a decreasing sinusoidal waveform.

Accordingly, a disconnection event could be detected by comparing the maximum peak of the AC voltage, which corresponds to the amplitude of the oscillation, with a given voltage reference. However, this solution would require the knowledge of the nominal amplitude of the AC voltage, which may also vary from 80 VAC to 260 VAC for different countries.

Thus, generally, the voltage at the capacitor 304 could be compared with a fixed lower voltage reference, such as 70 V. However, additional components, in particular inductors in the EMI filter, may introduce distortions in the signal S.

For example, this may be particularly relevant, when the signal S is measured with respect to the ground GND downstream the rectifier 310 as shown, e.g., in FIG. 15. In this case, the shape of the sensed signal S is also strongly dependent on the load conditions.

In this context, the inventors have observed that the peak value is almost defined by the AC mains peak value, but the lowest value (the so called valley value) depends strongly on the load conditions. For example, often this is due to the finite (and different from zero) value of the EMI filter impedance. Accordingly, in the case of a heavy load the valley value of signal S would be low, even close to zero. On the other hand, the valley value will be higher at light load conditions. Because of this a fixed low threshold could lead to a missed or wrong detection of the AC mains (with an undesired activation of the X-capacitor discharge).

Figure 6:
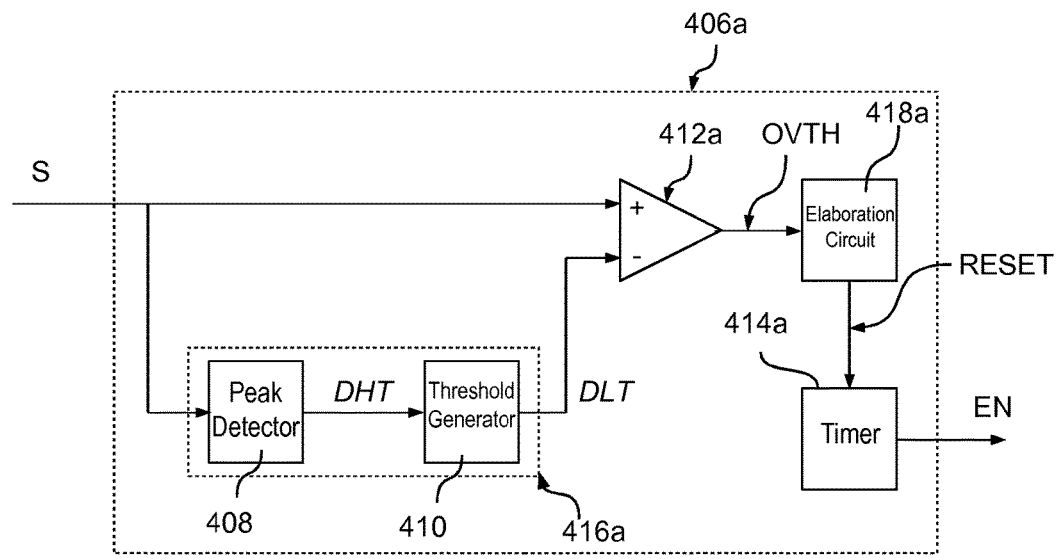
FIG. 6 shows a first embodiment of a processing unit of the detection circuit shown in FIG. 4.

FIG. 6 shows a first embodiment of a processing unit 406a in accordance with the present disclosure.

Specifically, in the embodiment considered, instead of using a fixed and preconfigured voltage reference, the solution determines a dynamic voltage threshold.

Specifically, in the embodiment considered, the processing unit 406a comprises comparator circuit 412a, a dynamic threshold generator circuit 416a, an elaboration circuit 418a and a timer circuit 414a.

Specifically, the dynamic threshold generator circuit 416a is configured to provide one or more threshold values for the comparator circuit 412a as a function of the signal S.

For example, in the embodiment considered, the dynamic threshold generator circuit 416a comprises a peak detector 408 and a threshold generator circuit 410.

Specifically, the peak detector 408 is configured to detect the maximum value in the signal S. For example, suitable peak detectors are described in the patent application U.S. Ser. No. 14/510,925 filed on Oct. 9, 2014, which is incorporated for this purpose herein by reference in its entirety.

Accordingly, when the device 30 is connected to the AC power source 20, the peak detector 408 will provide after one or more oscillations of the AC power signal the maximum value of the signal S, which represents the amplitude of the oscillation of the voltage $V_X$ at the capacitor 304. Accordingly, this peak value represents an upper dynamic threshold DHT for the signal S.

In the embodiment considered, the threshold generator circuit 410 uses this signal in order to generate at least one threshold value, such as a reference voltage signal, for the comparator circuit 412a.

For example, in an embodiment, the comparator circuit 412a comprises a single comparator configured to compare the signal S with a lower threshold DLT. In this case, the threshold generator circuit 410 may be configured to determine dynamically this lower threshold value DLT as a function of the upper dynamic threshold DHT. For example, the lower threshold DLT may be calculated by subtracting a given value from the threshold DHT, such as 20-50V, or by scaling the threshold DHT with a given percentage, such as 90%. Generally, the difference between the two thresholds may also be programmable, e.g., by means of software, trimming or metal options.

Accordingly, the lower threshold value DLT corresponds to a dynamic threshold which is determined as a function of the peak value of the voltage at the capacitor 304. Accordingly, in the embodiment considered, a signal OVTH at the output of the comparator 412a indicates weather the signal S, being indicative of the voltage at the capacitor 304, is greater than the lower threshold DLT.

Figure 7:
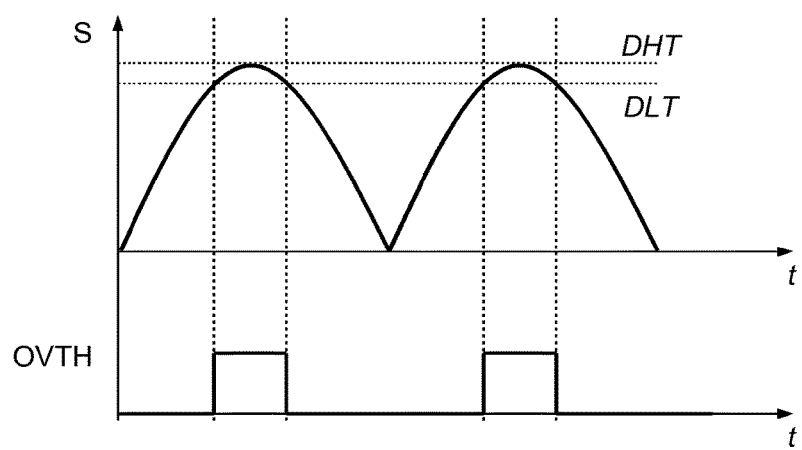
FIGS. 7, 8 and 9 show waveforms which may occur in the processing unit of FIG. 6.

For example, FIG. 7 shows a possible waveform for the signal OVTH which is set to a first logic level, e.g., "1", when the voltage at the capacitor 304 is greater than the lower threshold DLT and to a second logic level, e.g., "0", when the voltage at the capacitor 304 is smaller than the lower threshold DLT. Accordingly, as long as the AC power source 20 is connected to the device 30, a single pulse of the OVTH signal is generated for each half-wave of the rectified oscillation of the AC power source 20. Conversely, in the absence of a rectifier 316 or when using only a single diode in the rectifier circuit 316, a single pulse would be generated for each oscillation.

In an embodiment, the comparator circuit 412a may comprise instead a window comparator configured to determine whether the signal S is between a lower and an upper threshold. In this case, the threshold generator circuit 410 may be configured to provide both the lower dynamic threshold DLT and the upper dynamic threshold DHT to the window comparator of the comparator circuit 412a. Accordingly, in this case, the signal OVTH would indicate whether the signal S is between the lower and the upper dynamic thresholds DLT and DHT. For example, such a window comparator may improve robustness and effectiveness, and may be suitable when AC variations should be detected with higher precision/resolution Thus, when the device 30 is connected to the AC power source 20, the signal OVTH at the output of the comparator circuit 412a will comprise at least one pulse for a time period T corresponding to:

$$T = 1/f_{AC}.$$

where $f_{AC}$ is the frequency of the AC oscillation of the AC power source 20, which is usually 50 or 60 Hz.

Conversely, such pulses will be missing, when the device 30 is disconnected from the AC power source 20.

Figure 8:
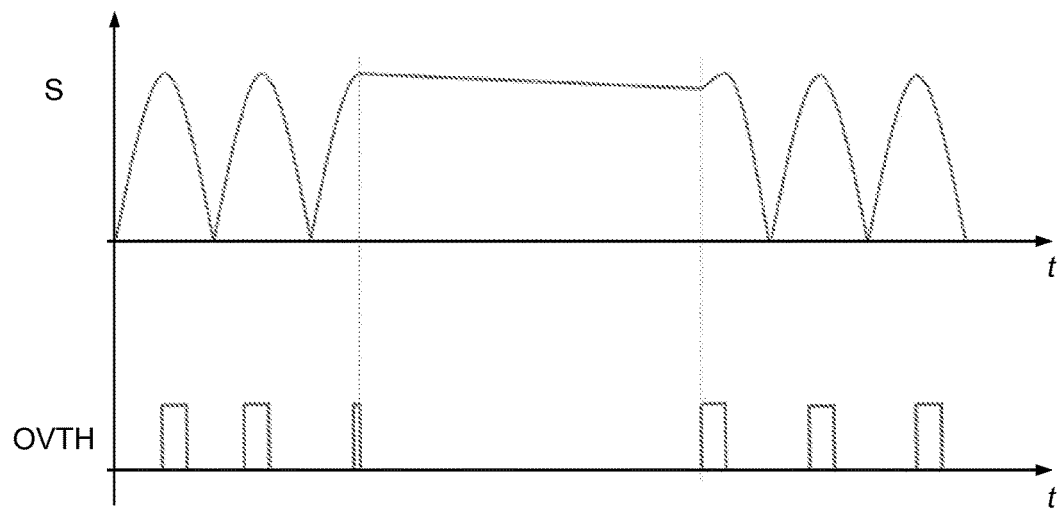

For example, FIG. 8 shows in this respect possible waveforms for the signal S and a corresponding signal OVTH.

Accordingly, in the embodiment considered, the timer circuit 414a is used to determine, similar to a watchdog timer or timeout counter, whether a given time period has lapsed since the last pulse occurred in the signal OVTH.

For example, such a timer circuit 414a may be implemented with a counter, which increases or decreases a count value until a given value has been reached and which is reset to a given initial value based on a reset signal RESET. Accordingly, in this case, such a timer circuit 414a may be reset as a function of the signal OVTH.

For example, in the embodiment considered, the signal OVTH is provided for this purpose to the elaboration circuit 418a, which determines a signal RESET for the timer circuit 414a as a function of the signal OVTH.

For example, in an embodiment, the elaboration circuit 418a is configured (based on the logic values of the signal OVTH) to reset or restart the timer circuit 414a at each raising edge of the signal OVTH, which represents a positive slope in the signal S. Accordingly, in this case, the timer circuit 414a may determine whether a given time period has lapsed since a last raising edge of the signal OVTH. For example, typically the time threshold or timeout value TO for the timer circuit 414a should correspond to several periods T of a typical oscillation of the AC power source, such as 40-100 ms. Accordingly, when the timer circuit 414a reaches the timeout value TO, the timer circuit 414a may enable the discharge circuit 50 via the signal EN in order to discharge the capacitor 304.

In an embodiment, the elaboration circuit 418a may be configured to reset the timer circuit 414a also at each falling edge of the signal OVTH. Accordingly, in this case, the timer circuit 414a is configured to enable the discharge circuit when the timer circuit reaches a given timeout value TO since the last raising or falling edged of the signal OVTH.

Thus generally, the timer circuit 414a enables the discharge circuit when a given time period has lapsed since the last raising and/or falling edge in the signal OVTH.

Conversely, different solutions may be used to determine when the discharge circuit 50 should be disabled or deactivated again.

For example, the timer circuit 414a could be configured to deactivate the discharge circuit 50 only at a raising edge in the signal OVTH, which indicates a positive slope in the signal S. For example, in this case, the elaboration circuit 418a may be configured to reset the timer circuit 414a via the signal RESET at each raising edge in the signal OVTH.

Conversely, the timer circuit 414a should not simply disable the discharge circuit 50 at a falling edge, because once the discharge circuit is enabled, the voltage at the capacitor 304 decreases, which could cause a falling edge in the signal OVTH.

Thus, in an embodiment, in order to avoid this problem, the elaboration circuit 418a is configured to determine whether the signal S shows slope changes (second order derivative) and eventually resets the timer circuit 414a.

For example, in an embodiment, the elaboration circuit 418a is configured to determine the time elapsed between two consecutive edges in the signal OVTH, i.e., between a raising edge and a falling edge or vice versa between a falling edge and a raising edge, thereby determining two values: a first value TH indicating the duration in which the signal OVTH was high and second value TL indicating the duration in which the signal OVTH was low. In this case, the elaboration circuit 418a may be configured to compare these durations with at least one time threshold value in order to determine whether these durations are within given limits. For example, in an embodiment the elaboration circuit 418a may determine whether the first duration TH and the second duration TL are both smaller than a timeout value TO, which could correspond to the duration of several periods or sub-periods of a typical AC oscillation, e.g., 5, 10, 20-100 ms. Accordingly, in this case, the elaboration circuit 418a could reset the timer circuit 414a thus disabling the discharge circuit 50 only when the durations TH and/or TL are within the specified limits.

Figure 9:
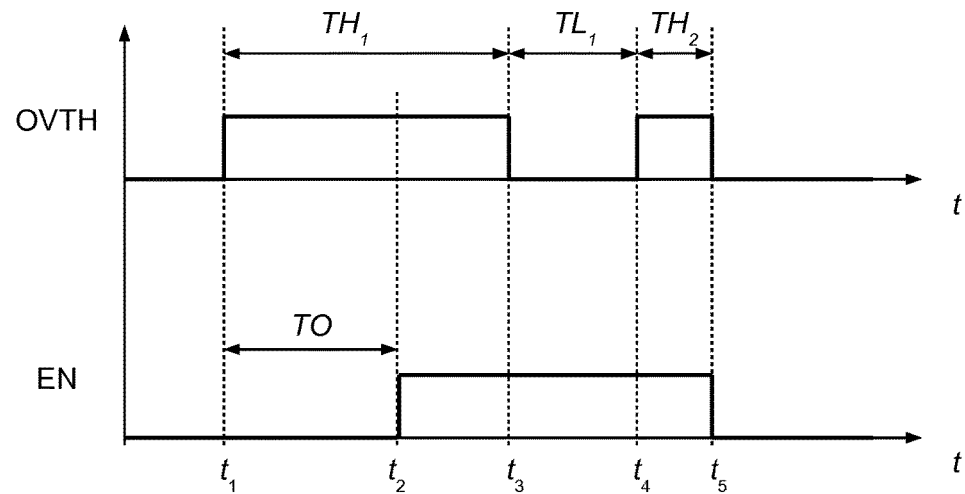

For example, FIG. 9 shows for this embodiment a possible waveform for the signal OVTH and a respective enable signal EN for the discharge circuit 50.

Specifically, in the example considered:
  at a time $t_1$ the voltage of the signal S reaches the lower voltage threshold DLT,
  at a time $t_3$ the voltage of the signal S falls below the lower voltage threshold DLT,
  at a time $t_4$ the voltage of the signal S again reaches the lower voltage threshold DLT, and
  at a time $t_5$ the voltage of the signal S again falls below the lower voltage threshold DLT.

Accordingly, in the embodiment considered, the signal OVTH includes two pulses. Moreover, in the example considered, the duration $TH_1$ of the first pulse and the duration $TL_1$ are greater than the timeout value TO and the duration $TH_2$ of the second pulse is smaller than the timeout value TO. Accordingly, considering the above configuration of the elaboration circuit 418a, the timer circuit 414a will enable the discharge circuit 50 once the time TO has elapsed since the first raising edge, i.e., at a time $t_2$. Conversely, the elaboration circuit 418a will reset the timer circuit 414a, thereby deactivating the discharge circuit 50, only at the second falling edge at time $t_5$, because only at this moment the elaboration circuit 414 is able to determine the duration $TH_2$ of the second pulse and compare this duration with the timeout value TO.

This method has the further advantage that low variation of AC input voltage may be filtered automatically.

Figure 10:
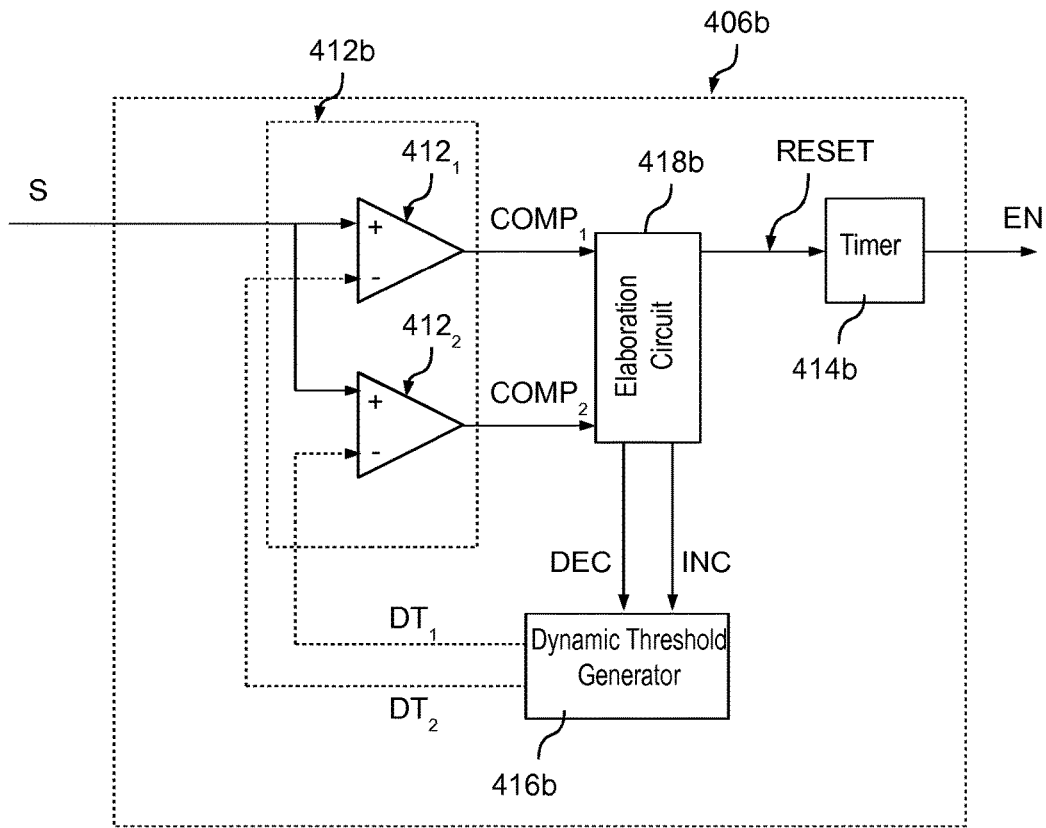
FIG. 10 shows a second embodiment of a processing unit of the detection circuit shown in FIG. 4.

FIG. 10 shows a second embodiment of the processing unit 406b.

Specifically, also in this embodiment, the processing unit 406b comprises comparator circuit 412b, a dynamic threshold generator circuit 416b, an elaboration circuit 418b and a timer circuit 414b. Also in this case, the dynamic threshold generator circuit 416b is configured to provide at least one threshold value to the comparator circuit 412b, which has been determined as a function of the signal S, and the elaboration circuit 418b is configured to reset the timer circuit 414b as a function of one or more signals at the output of the comparator circuit 412b.

However, while in the embodiment shown in FIG. 6, the threshold value(s) were determined in a feed-forward or open-loop manner directly based on the signal S, in the embodiment considered, the threshold values are updated in a feed-back or closed loop manner based on the signals at the output of the comparator circuit 412b.

Specifically, in the embodiment considered, the comparator circuit 412b comprises two comparators $412_1$ and $412_2$, which compare the signal S with two dynamic threshold values $DT_1$ and $DT_2$ being provided by the dynamic threshold generator circuit 416b.

Accordingly, in the embodiment considered, the signal $COMP_1$ at the output of the first comparator $412_1$ indicates weather the signal S is greater than the voltage reference signal $DT_1$ and the signal $COMP_2$ at the output of the second comparator $412_2$ indicates weather the signal S is greater than the voltage reference signal $DT_2$.

In the embodiment considered, the comparator circuit 412b provides the comparison signals $COMP_1$ and $COMP_2$ to the elaboration circuit 418b, such as a combinational circuit, which is configured to determine, based on the signals $COMP_1$ and $COMP_2$ whether the signal S is increasing or decreasing.

Specifically, in the embodiment considered, the elaboration circuit 418b provides for this purpose a signal INC indicating that the signal S is greater than both $DT_1$ and $DT_2$, and a signal DEC indicating that the signal S is smaller than both $DT_1$ and $DT_2$.

Figure 11:
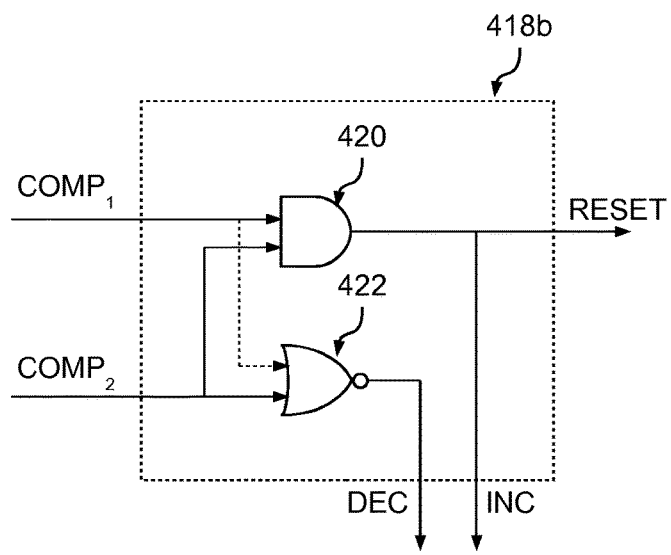
FIGS. 11, 13 and 16 show details of the processing unit of FIG. 10.

For example FIG. 11 shows a possible embodiment of the elaboration circuit 418b for the logic levels of the signals $COMP_1$ and $COMP_2$ which result from the connection of the signals to the positive and negative input terminals of the comparators $412_1$ and $412_2$ as shown in FIG. 10. Specifically, in this case, the signal INC may be obtained via an AND gate 420 and the signal DEC may be obtained via an NOR gate 422, wherein both gates receive the signals $COMP_1$ and $COMP_2$ as input.

Accordingly, the dynamic threshold generator circuit 416b is able to determine (via the comparator circuit 412b) whether the signal S is greater than (e.g., INC="1" and DEC="0"), smaller than (e.g., INC="0" and DEC="1") or between the threshold values $DT_1$ and $DT_2$ (e.g., INC="0" and DEC="0"). In the embodiment considered, the dynamic threshold generator circuit 416b uses this information in order to vary the thresholds $DT_1$ and $DT_2$.

Figure 16:
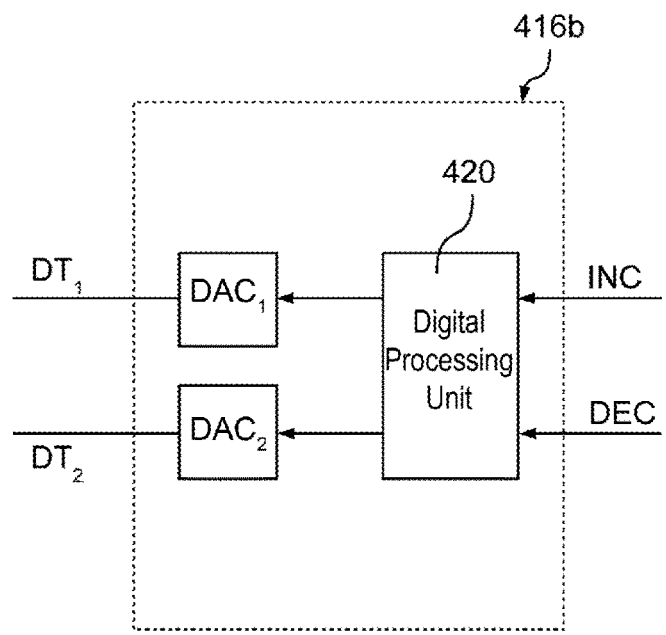

For example, FIG. 16 shows a possible embodiment of dynamic threshold generator circuit 416b. In the embodiment considered, the signals INC and DEC are provided to a digital processing unit 420, such as a microprocessor. The digital processing unit 420 elaborates the signals INC and DEC and sets the threshold values $DT_1$ and $DT_2$ via respective digital-to-analog converters $DAC_1$ and $DAC_2$.

Figure 12A:
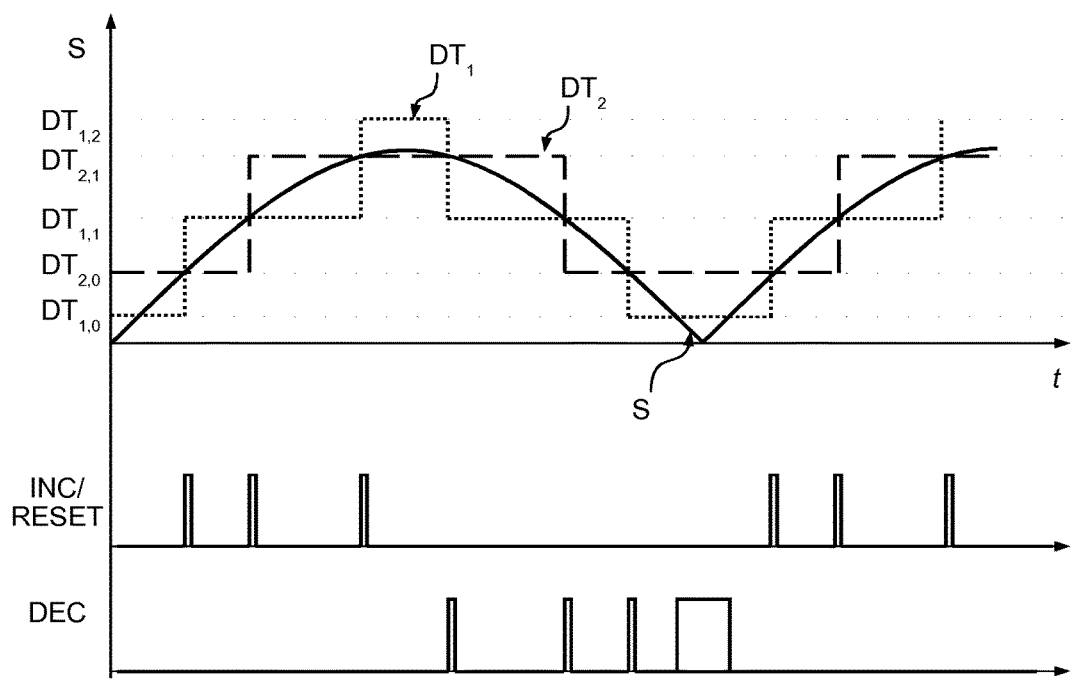
FIGS. 12a and 12b show waveforms which may occur in the processing unit of FIG. 10.

FIG. 12a shows in that respect a possible operation of an embodiment of the dynamic threshold generator circuit 416b.

In the embodiment considered, initially the threshold $DT_1$ and $DT_2$ are set to respective initial values, e.g., $DT_1=DT_{1,0}$ and $DT_2=DT_{2,0}$, wherein one of the thresholds is greater than the other one, i.e., one threshold represents a lower threshold and the other threshold represents a higher threshold, e.g., $DT_{2,0}>DT_{1,0}$.

Once the signal INC indicates that the signal S is greater than $DT_1$ and $DT_2$, i.e., $S>DT_{1,0}$ and $S>DT_{2,0}$, the circuit 416b assigns a new value to the lower threshold, wherein the new value is greater than the previous higher threshold. For example, in the example considered, the threshold $DT_1$ is assigned a new value $DT_{1,1}$, with $DT_{1,1}>DT_{2,0}$. Thus the previous lower threshold becomes the new higher threshold (being greater than the current value of the signal S) and intrinsically the signal INC changes again the logic state.

This scheme is repeated each time the signal INC goes to high, thereby following the raising slope of the signal S. For example, in the embodiment considered, the signal S exceeds three times the thresholds $DT_1$ and $DT_2$ till the thresholds are set to $DT_1=DT_{1,2}$ and $DT_2=DT_{2,1}$.

Accordingly, in the embodiment considered, one of the two thresholds represents a lower threshold and the other represents a higher threshold and when the signal INC indicates that the signal S is greater than both thresholds, the circuit 416b increases the lower threshold value such that the lower threshold value becomes the new higher threshold value.

Conversely, when the signal S is decreasing again, at a given moment the signal DEC will show that the signal S is smaller than $DT_1$ and $DT_2$, i.e., $S<DT_{1,2}$ and $S<DT_{2,1}$. At this moment, the circuit 416b will decrease the current higher threshold. For example, in FIG. 12a, the signal $DT_1$ will be set to a new value $DT_{1,1}$, which is smaller than the current value of $DT_2$.

Accordingly, in the embodiment considered, when the signal DEC indicates that the signal S is smaller than both thresholds, the circuit 416b decreases the higher threshold value such that the higher threshold value becomes the new lower threshold value.

Thus, by repeating the above operation, the processing unit 406b is able to follow the waveform of the signal S. Moreover, the signals INC and DEC show respectively whether the signal S has a positive slop or a negative slope.

In an embodiment, at least four levels are used for each of the thresholds $DT_1$ and $DT_2$. For example, FIG. 13 shows a table of typical values of 7 levels L for each of the thresholds $DT_1$ and $DT_2$. Specifically, these values are suitable both for 110 VAC and 230 VDC applications. Those of skill in the art will appreciate that the values indicated relate to the absolute threshold values with respect to the amplitude of the voltage $V_X$, which eventually should be scaled based on the ratio of the voltage detection circuit 404b.

Generally, as shown in FIG. 12a, when the signal S decreases to zero, the thresholds may be maintained at the lowest level, e.g., levels $DT_{1,0}$ and $DT_{2,0}$, which are greater than zero. Accordingly, in this case, the signal DEC will remain high until the signal S increases again exceeding the lower threshold, e.g., $DT_{1,0}$ in FIG. 12a.

Figure 12B:
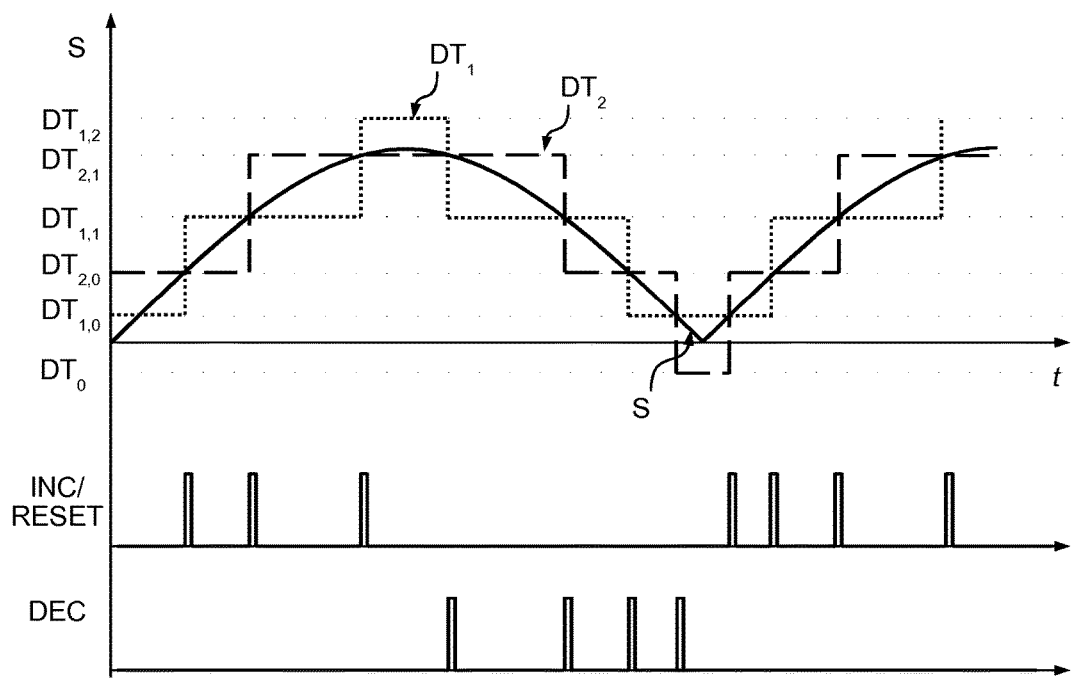

Conversely, FIG. 12b shows an embodiment, in which the processing unit 406b assigns in this case a default value $DT_0$, being at most zero or even negative. Specifically, when the threshold values have reached the lowest levels, e.g., levels $DT_{1,0}$ and $DT_{2,0}$, and the signal DEC goes to high, the processing unit assigns to the current higher threshold this default value, e.g., $DT_2=DT_0$.

Thus, generally, the levels of the thresholds signals $DT_1$ and $DT_2$ are configured such that the signals INC and DEC comprise (in the presence of an AC power supply signal) a plurality of pulses for each raising or falling slope of the signal S respectively.

Accordingly, similar to the previous embodiment shown in FIG. 6, the elaboration circuit 418b may be configured to reset the timer circuit 414b via a signal RESET as a function of the signals provided by the comparator circuit 412b, i.e., the signals INC and DEC.

For example, in the embodiment shown in FIG. 11, the signal RESET corresponds to the signal INC, i.e., the signal RESET comprises only the pulses of the signal INC, showing in this way a positive slope of the signal S.

However, while in the previous embodiment was required some kind of logic in order to analyze the waveform of the signal OVTH, e.g., in order to determine the raising edge of the signal OVTH, in this case, the signal INC comprises only short pulses and accordingly this signal could be used directly to reset to timer circuit 414b.

Generally, the embodiments shown with respect to FIGS. 6 and 10 may also be combined and components may be reused, e.g., only a single timer circuit may be used instead of two separate timer circuits 414a and 414b. For example, in this case, the signal RESET provided by the elaboration circuit 418a of FIG. 6 could be combined, e.g., via a logic OR gate, with the signal RESET provided by the elaboration circuit 418b of FIG. 10.

Figure 17:
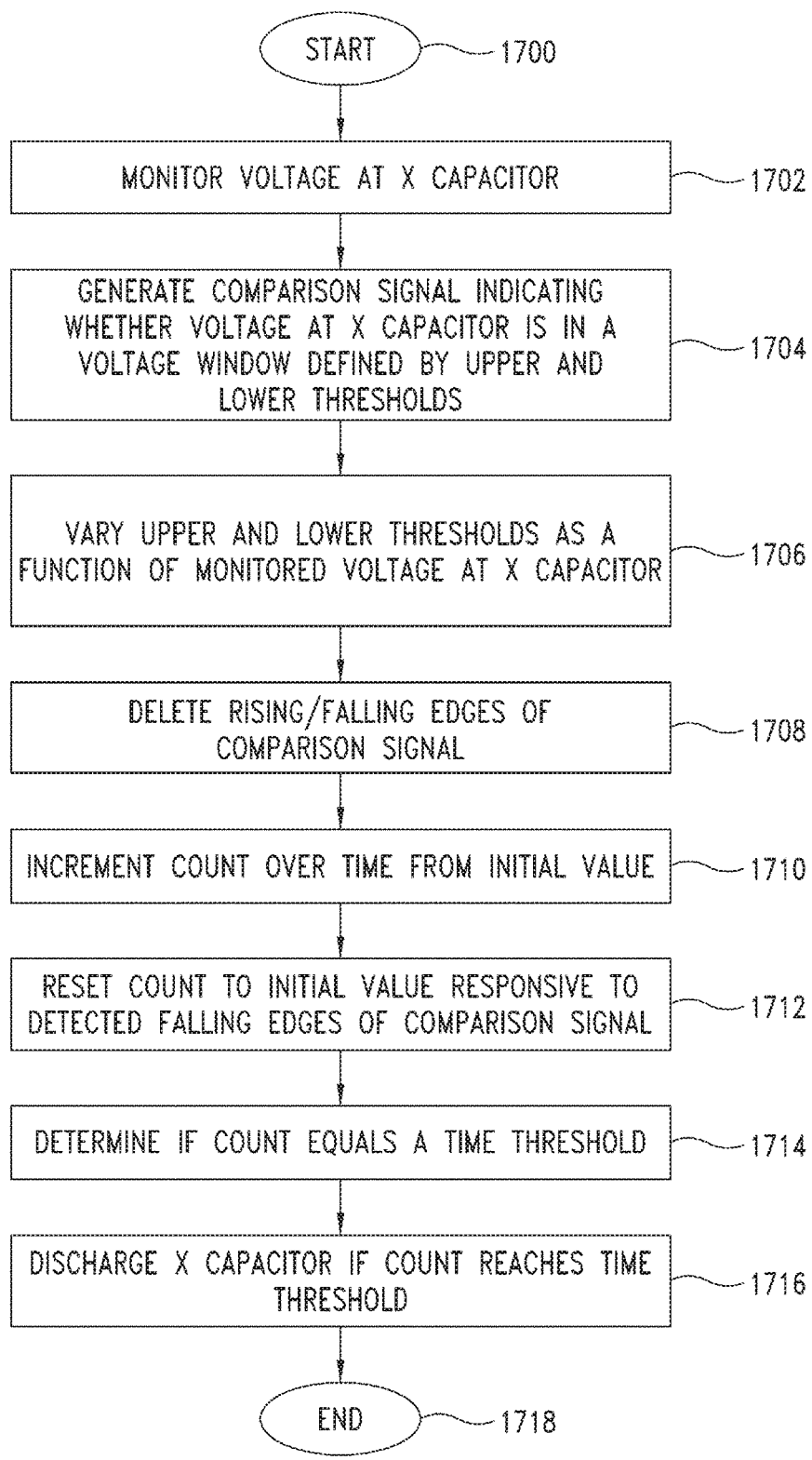
FIG. 17 is a flowchart illustrating the operation of the discharge circuit of FIGS. 2 and 3 according to one embodiment of the present disclosure.

FIG. 17 is a flowchart illustrating the operation of the discharge circuit 308 of FIGS. 2 and 3 according to one embodiment of the present disclosure. The method of detecting whether an AC oscillation is applied to an X capacitor of a device begins in step 1700 and proceeds to step 1702 monitors a voltage at said X capacitor and proceeds to step 1704 and generate at least one comparison signal indicating whether said voltage at said X capacitor is contained in a voltage window defined by a lower threshold value and an upper threshold value. From step 1704 the process goes to step 1706 and varies said upper and lower threshold values as a function of said monitored voltage at said X capacitor. The process then goes to step 1708 and detects at least one of leading and falling edges of the comparison signal and then goes to step 1710 and increments a count value over time starting from an initial value for the count value. From step 1710 the process goes to step 1712 and resets the count value to the initial value as a function of the detected at least one of leaving and falling edges of the comparison signal. After step 1712 the process goes to step 1714 and determines whether the count value has reached a time threshold value and then goes t step 1716 and discharges the X capacitor responsive to the time count reaching the time threshold value. The process then terminates in step 1718. In one embodiment, step 1701 includes generating a sensor signal responsive to the voltage at said X capacitor and determining the upper threshold value indicative of a peak value of said sensor signal and determining the lower threshold value as a function of said upper threshold value. The count value in one embodiment indicates a time between leading and falling edges of the comparison signal. In one embodiment, varying said at least one threshold as a function of said monitored voltage at said X capacitor comprises varying the at least one threshold value as a function the comparison signal. In an embodiment, the comparison signal comprises first and second comparison signals and the method further includes generating a first comparison signal indicating whether said monitored voltage at said X capacitor is greater than a first threshold value and generating a second comparison signal indicating whether said monitored voltage at said X capacitor is greater than a second threshold value.

Such a combination of the circuits provides a system solution suitable for a wide range of applicative conditions (e.g., EMI filter structures, load conditions, etc.). The circuit combination is a reliable and effectiveness solution regardless system operating conditions.

Of course, without prejudice to the principles of the present disclosure, the details of construction and the embodiments may vary widely with respect to what has been described and illustrated herein purely by way of example, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A detection circuit, comprising:
a sensor circuit configured to be coupled to an X capacitor, said sensor circuit configured to generate a sensor signal indicative of a voltage at said X capacitor;
a window comparator configured to generate a comparison signal indicating whether said sensor signal is between a lower threshold value and an upper threshold value;
a timer circuit configured to:
set a discharge enable signal to a first logic level in response to said timer circuit being reset via a reset signal; and
determine a time elapsed since said timer circuit has been reset via the reset signal;
determine whether said time elapsed exceeds a given timeout value; and
if said time elapsed exceeds said given timeout value, set said discharge enable signal to a second logic level to cause the active discharge circuit to discharge the X capacitor;
an elaboration circuit configured to generate said reset signal for said timer circuit as a function of said comparison signal, the elaboration circuit configured to:
detect whether said comparison signal includes both a leading and a falling edge; and
in the case where said comparison signal includes both said leading edge and said falling edge, determine a time elapsed between said leading edge and said falling edge;
detect whether said time elapsed between said leading edge and said falling edge is smaller than a given time threshold value; and
reset said timer circuit via said reset signal in response to detecting that said time elapsed between said leading and said falling edge is smaller than said given time threshold value; and
to generate, based on the comparison signal from said window comparator, first and second control signals indicating whether the sensor signal is increasing or decreasing; and
a dynamic threshold generator circuit configured to generate said lower and upper threshold values of said window comparator based on the sensor signal, and said dynamic threshold generator circuit further configured to vary in a feed-back manner said lower and upper threshold values of said window comparator as a function of said first and second control signals from said elaboration circuit.

2. The detection circuit of claim 1, wherein said elaboration circuit is configured to:
   detect an edge of said comparison signal; and
   reset said timer circuit via said reset signal in response to detecting the edge of said comparison signal.

3. The detection circuit of claim 1, wherein said dynamic threshold generator circuit is configured to vary in a feed-forward manner said lower and upper threshold values of said window comparator as a function of said sensor signal.

4. The detection circuit of claim 3, wherein said dynamic threshold generator circuit comprises:
   a peak detector circuit configured to determine the upper threshold value indicative of a peak value of said sensor signal; and
   a threshold generator circuit configured to determine the lower threshold value as a function of said upper threshold value.

5. The detection circuit of claim 1, wherein said window comparator comprises:
   a first comparator configured to generate a first comparison signal indicating whether said sensor signal is greater than the lower threshold value; and
   a second comparator configured to generate a second comparison signal indicating whether said sensor signal is greater than the upper threshold value.

6. The detection circuit of claim 5, wherein said elaboration circuit is further configured to:
   generate, based on said first and said second comparison signals from the window comparator, the first control signal indicating whether said sensor signal is greater than both of said upper and lower threshold values;
   generate, based on said first and said second comparison signals from the window comparator, the second control signal indicating whether said sensor signal is smaller than both of said upper and lower threshold values; and
   reset said timer circuit via said reset signal in response to said first and said second comparison signals indicating that said sensor signal is greater than both of said first and second threshold values.

7. The detection circuit of claim 6, wherein said dynamic threshold generator circuit is further configured to determine, based on the first and second control signals, whether said first and said second comparison signals indicate that said sensor signal is greater than both of said upper and lower threshold values, smaller than both of said upper and lower threshold values, or between said upper and lower threshold values, and wherein the dynamic threshold generator circuit is further configured, in response to said first and second control signals indicating that said sensor signal is greater than both of said upper and lower threshold values, to increase the lower threshold value to a new value that is greater than a current value of the upper threshold value, and wherein the dynamic threshold generator circuit is further configured, in response to said first and second control signals indicating that said sensor signal is smaller than both of said upper and lower threshold values, to decrease the upper threshold value to a value that is smaller than a current value of the lower threshold value.

8. An active discharge circuit, comprising:
   a detection circuit configured to generate a discharge enable signal signaling whether an AC oscillation is applied to an X capacitor of a device, wherein said detection circuit comprises:
      a sensor circuit for connection to said X capacitor, said sensor circuit configured to generate a sensor signal indicative of the voltage at said X capacitor;
      a window comparator circuit configured to generate at least one comparison signal by comparing said sensor signal with a high threshold and a low threshold, the window comparator circuit including:
         a first comparator configured to generate a first comparison signal indicating whether said sensor signal is greater than a first threshold value; and
         a second comparator configured to generate a second comparison signal indicating whether said sensor signal is greater than a second threshold value;
      a timer circuit configured to:
         set said discharge enable signal to a first logic level responsive to said timer circuit being reset via a reset signal;
         determine the time elapsed since said timer circuit has been reset via a reset signal;
         test whether said time elapsed exceeds a given timeout value; and
         in case said time elapsed exceeds said given timeout value, set said discharge enable signal to a second logic level;
      an elaboration circuit configured to generate said reset signal for said timer circuit and to generate a first control signal and a second control signal as a function of said first and second comparison signals; and
      a dynamic threshold generator circuit configured to vary said high and low threshold of said comparator circuit in response to said first and second control signals, the dynamic threshold generator circuit further configured to:
         determine which of said first and second threshold values is greater;
         determine whether said first and said second comparison signals indicate that said sensor signal is greater than both of said first and second threshold values;
         determine whether said first and second comparison signals indicate that said sensor signal is smaller than both of said first and second threshold values;
         where said first and said second comparison signals indicate that said sensor signal is greater than both of said first and second threshold values, increase the smaller one of said first or said second threshold values; and
         where said first and said second comparison signals indicate that said sensor signal is smaller than both of said first and second threshold values, decrease the greater one of said first and said second threshold values; and
   a discharge circuit adapted to be coupled to said X-capacitor and configured to discharge said X-capacitor as a function of said discharge enable signal generated by said detection circuit.

9. The active discharge circuit of claim 8, wherein said discharge circuit comprises at least one electronic switch connected to a resistive element and/or a current generator.

10. The active discharge circuit of claim 9, wherein the resistive element comprises a resistor and the current generator comprises a constant current generator, or either a linear or non-linear current generator.

11. A method, comprising:
   detecting whether an AC oscillation is applied to an X capacitor of a device, the detecting including:
      monitoring a voltage at said X capacitor;
      generating at least one comparison signal indicating whether said voltage at said X capacitor is contained in a voltage window defined by a lower threshold value and an upper threshold value;

generating, based on the at least one comparison signal, first and second control signals indicating whether said monitored voltage is increasing or decreasing;

varying said upper and lower threshold values based on feed-back based on feed-back as a function of said first and second control signals;

detecting said AC oscillation is applied to said X capacitor based on said monitored voltage at said X capacitor and said upper and lower threshold values; detecting at least one of leading or falling edges of the comparison signal; incrementing a count value over time starting from an initial value for the count value, the count value indicating a time between the at least one of leading or falling edges of the comparison signal; resetting the count value to the initial value as a function of the detected at least one of leading or falling edges of the comparison signal; determining whether the count value has reached a time threshold value; and discharging the X capacitor responsive to the time count reaching the time threshold value.

12. The method of claim 11, wherein monitoring the voltage at said X capacitor comprises:

generating a sensor signal responsive to the voltage at said X capacitor;

determining the upper threshold value indicative of a peak value of said sensor signal; and determining the lower threshold value as a function of said upper threshold value.

13. The method of claim 11, wherein varying said at least one threshold as a function of said monitored voltage at said X capacitor comprises varying the at least one threshold value as a function the comparison signal.

14. The method of claim 13, wherein the comparison signal comprises first and second comparison signals and wherein the method further comprises:

generating a first comparison signal indicating whether said monitored voltage at said X capacitor is greater than a first threshold value; and generating a second comparison signal indicating whether said monitored voltage at said X capacitor is greater than a second threshold value.

* * * * *

UNITED STATES PATENT AND TRADEMARK OFFICE
CERTIFICATE OF CORRECTION

PATENT NO.         : 10,345,348 B2
APPLICATION NO.    : 14/838125
DATED              : July 9, 2019
INVENTOR(S)        : Massimiliano Gobbi et al.

Page 1 of 1

It is certified that error appears in the above-identified patent and that said Letters Patent is hereby corrected as shown below:

In the Claims

Column 17, Lines 5-6 Claim 11:
"feed-back based on feed-back as a function of said first and second control signals;" should read,
--feed-back as a function of said first and second control signals;--.

Signed and Sealed this
Seventeenth Day of September, 2019

Andrei Iancu
*Director of the United States Patent and Trademark Office*